United States Patent
Mukaida et al.

(10) Patent No.: US 7,020,739 B2
(45) Date of Patent: Mar. 28, 2006

(54) MEMORY CONTROLLER, FLASH MEMORY SYSTEM HAVING MEMORY CONTROLLER AND METHOD FOR CONTROLLING FLASH MEMORY DEVICE

(75) Inventors: Naoki Mukaida, Tokyo (JP); Kenzo Kita, Tokyo (JP); Yukio Terasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 444 days.

(21) Appl. No.: 10/011,248

(22) Filed: Dec. 5, 2001

(65) Prior Publication Data

US 2003/0028704 A1    Feb. 6, 2003

(30) Foreign Application Priority Data

Dec. 6, 2000    (JP) .............................. 2000-371515

(51) Int. Cl.
*G06F 12/00*    (2006.01)

(52) U.S. Cl. ........................... 711/103; 711/5; 711/102; 711/205; 711/206; 365/230.03; 365/236

(58) Field of Classification Search .................... 711/5, 711/206, 102, 103, 205; 365/230.03, 230.04, 365/236, 23
See application file for complete search history.

(56) References Cited

U.S. PATENT DOCUMENTS

| 5,457,658 | A | | 10/1995 | Niijima |
| 5,835,935 | A | | 11/1998 | Estakhri |
| 5,930,193 | A | * | 7/1999 | Achiwa et al. ......... 365/230.03 |
| 6,119,214 | A | * | 9/2000 | Dirks ......................... 711/206 |
| 6,172,906 | B1 | * | 1/2001 | Estakhri et al. ........ 365/185.11 |
| 6,295,599 | B1 | * | 9/2001 | Hansen et al. ................. 712/32 |
| 6,721,843 | B1 | * | 4/2004 | Estakhri ..................... 711/103 |

\* cited by examiner

*Primary Examiner*—Donald Sparks
*Assistant Examiner*—Ngoc Dinh
(74) *Attorney, Agent, or Firm*—Brown Raysman Millstein Felder & Steiner LLP

(57) ABSTRACT

An object of the present invention is to provide a memory controller that can perform a series of data write operations so as to complete the data writing at high speed.

A memory controller includes means for dividing the physical blocks into a plurality of groups, means for forming a plurality of virtual blocks by virtually combining a plurality of physical blocks each of which belongs to a different group, and means for assigning adjacent host addresses to different physical blocks belonging to the same virtual block. Thus, when a host computer issues a request to access the plurality of successive host addresses, the physical blocks to be accessed are different physical blocks. Since the physical blocks to be accessed can therefore operate independently, a series of operations can be performed in parallel.

14 Claims, 28 Drawing Sheets

FIG. 7

| BLOCK #150 | BLOCK #6811 | BLOCK #8191 | BLOCK #3048 |
|---|---|---|---|
| VIRTUAL PAGE #0 | VIRTUAL PAGE #1 | VIRTUAL PAGE #2 | VIRTUAL PAGE #3 |
| VIRTUAL PAGE #4 | VIRTUAL PAGE #5 | VIRTUAL PAGE #6 | VIRTUAL PAGE #7 |
| VIRTUAL PAGE #8 | VIRTUAL PAGE #9 | VIRTUAL PAGE #10 | VIRTUAL PAGE #11 |
| ... | ... | ... | ... |
| VIRTUAL PAGE #124 | VIRTUAL PAGE #125 | VIRTUAL PAGE #126 | VIRTUAL PAGE #127 |

FIG. 8

| | SLOT#0 | SLOT#1 | SLOT#2 | SLOT#3 |
|---|---|---|---|---|
| FLAG | CELL#0-0 | CELL#0-1 | CELL#0-2 | CELL#0-3 |
| FLAG | CELL#1-0 | CELL#1-1 | CELL#1-2 | CELL#1-3 |
| ⋮ | ⋮ | ⋮ | ⋮ | ⋮ |
| FLAG | CELL#7999-0 | CELL#7999-1 | CELL#7999-2 | CELL#7999-3 |

27

VIRTUAL BLOCK INDICATING AREA #0
VIRTUAL BLOCK INDICATING AREA #1

VIRTUAL BLOCK INDICATING AREA #7999

FIG. 9

|  | SLOT #0 | SLOT #1 | SLOT #2 | SLOT #3 |
|---|---|---|---|---|
| QUEUE SET #0 | QUEUE #0-0 | QUEUE #0-1 | QUEUE# 0-2 | QUEUE #0-3 |
| QUEUE SET #1 | QUEUE #1-0 | QUEUE #1-1 | QUEUE# 1-2 | QUEUE #1-3 |
| QUEUE SET #2 | QUEUE #2-0 | QUEUE #2-1 | QUEUE# 2-2 | QUEUE #2-3 |
| QUEUE SET #3 | QUEUE #3-0 | QUEUE #3-1 | QUEUE# 3-2 | QUEUE #3-3 |
| QUEUE SET #4 | QUEUE #4-0 | QUEUE #4-1 | QUEUE# 4-2 | QUEUE #4-3 |
| QUEUE SET #5 | QUEUE #5-0 | QUEUE #5-1 | QUEUE# 5-2 | QUEUE #5-3 |

30

F I G. 1 7

| BLOCK #4 | BLOCK #6801 | BLOCK #3242 | BLOCK #8191 |
|---|---|---|---|
| VIRTUAL PAGE #0 | VIRTUAL PAGE #1 | VIRTUAL PAGE #2 | VIRTUAL PAGE #3 |
| VIRTUAL PAGE #4 | VIRTUAL PAGE #5 | VIRTUAL PAGE #6 | VIRTUAL PAGE #7 |
| VIRTUAL PAGE #8 | VIRTUAL PAGE #9 | VIRTUAL PAGE #10 | VIRTUAL PAGE #11 |
| ⋮ | ⋮ | ⋮ | ⋮ |
| VIRTUAL PAGE #124 | VIRTUAL PAGE #125 | VIRTUAL PAGE #126 | VIRTUAL PAGE #127 |

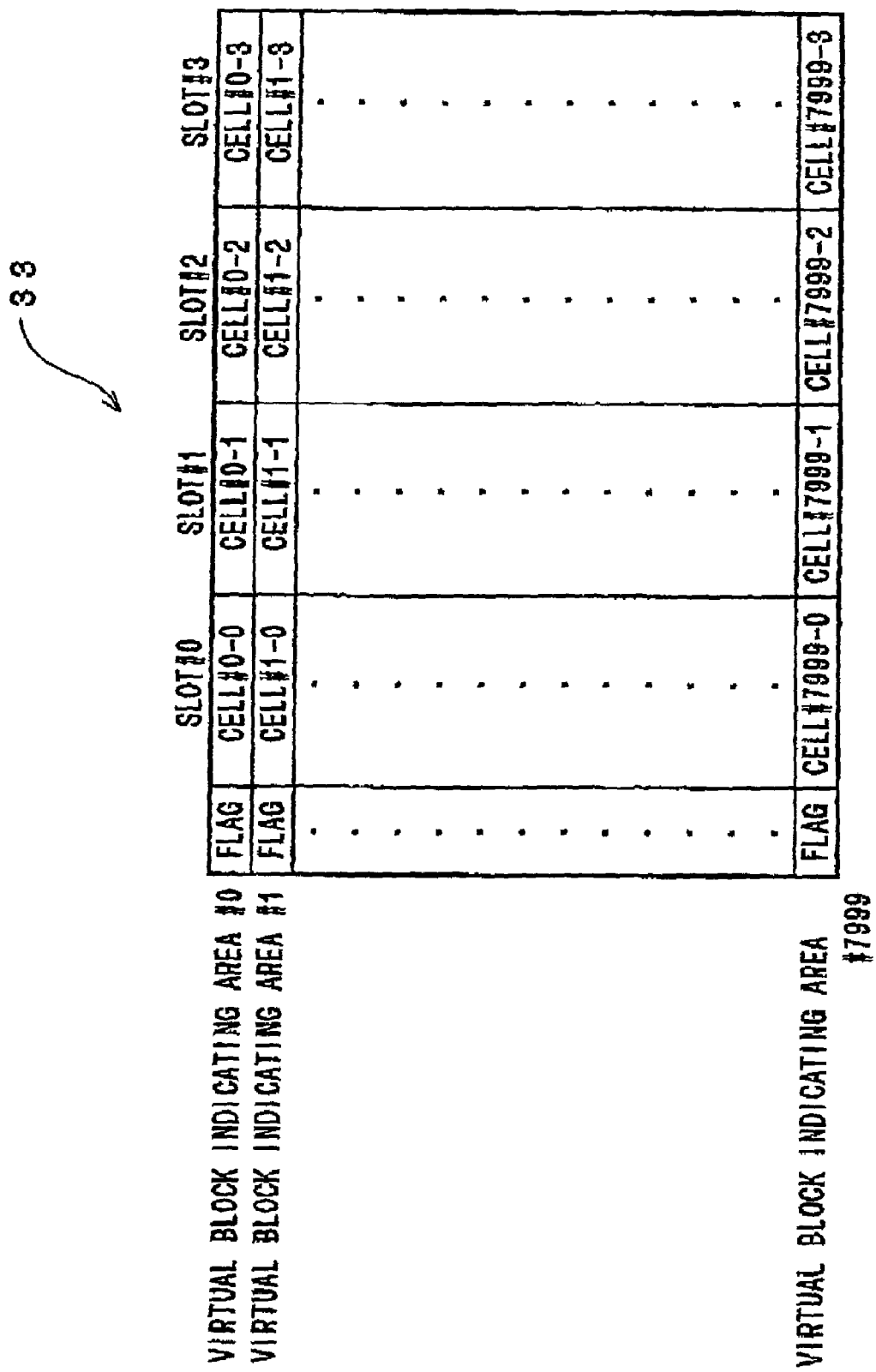

| | SLOT #0 | SLOT #1 | SLOT #2 | SLOT #3 |
|---|---|---|---|---|
| QUEUE SET #0 | QUEUE#0-0 | QUEUE#0-1 | QUEUE#0-2 | QUEUE#0-3 |
| QUEUE SET #1 | QUEUE#1-0 | QUEUE#1-1 | QUEUE#1-2 | QUEUE#1-3 |
| QUEUE SET #2 | QUEUE#2-0 | QUEUE#2-1 | QUEUE#2-2 | QUEUE#2-3 |
| QUEUE SET #3 | QUEUE#3-0 | QUEUE#3-1 | QUEUE#3-2 | QUEUE#3-3 |

FIG. 25

| | SLOT #0 | SLOT #1 | SLOT #2 | SLOT #3 | SLOT #4 | SLOT #5 | SLOT #6 | SLOT #7 |
|---|---|---|---|---|---|---|---|---|
| | CELL #0-0 | CELL #0-1 | CELL #0-2 | CELL #0-3 | CELL #0-4 | CELL #0-5 | CELL #0-6 | CELL #0-7 |
| VIRTUAL BLOCK INDICATING AREA #0 FLAG | | | | | | | | |
| VIRTUAL BLOCK INDICATING AREA #1 FLAG | CELL #1-0 | CELL #1-1 | CELL #1-2 | CELL #1-3 | CELL #1-4 | CELL #1-5 | CELL #1-6 | CELL #1-7 |
| ... | ... | ... | ... | ... | ... | ... | ... | ... |
| VIRTUAL BLOCK INDICATING AREA #3999 FLAG | CELL #3999-0 | CELL #3999-1 | CELL #3999-2 | CELL #3999-3 | CELL #3999-4 | CELL #3999-5 | CELL #3999-6 | CELL #3999-7 |

| | SLOT #0 | SLOT #1 | SLOT #2 | SLOT #3 | SLOT #4 | SLOT #5 | SLOT #6 | SLOT #7 |
|---|---|---|---|---|---|---|---|---|
| QUEUE SET #0 | QUEUE#0-0 | QUEUE#0-1 | QUEUE#0-2 | QUEUE#0-3 | QUEUE#0-4 | QUEUE#0-5 | QUEUE#0-6 | QUEUE#0-7 |
| QUEUE SET #1 | QUEUE#1-0 | QUEUE#1-1 | QUEUE#1-2 | QUEUE#1-3 | QUEUE#1-4 | QUEUE#1-5 | QUEUE#1-6 | QUEUE#1-7 |
| QUEUE SET #2 | QUEUE#2-0 | QUEUE#2-1 | QUEUE#2-2 | QUEUE#2-3 | QUEUE#2-4 | QUEUE#2-5 | QUEUE#2-6 | QUEUE#2-7 |
| QUEUE SET #3 | QUEUE#3-0 | QUEUE#3-1 | QUEUE#3-2 | QUEUE#3-3 | QUEUE#3-4 | QUEUE#3-5 | QUEUE#3-6 | QUEUE#3-7 |

37

MEMORY CONTROLLER, FLASH MEMORY SYSTEM HAVING MEMORY CONTROLLER AND METHOD FOR CONTROLLING FLASH MEMORY DEVICE

BACKGROUND OF THE INVENTION

The present invention relates to a memory controller, a flash memory system and a method for controlling a flash memory device, and particularly, to such a memory controller and flash memory system that can perform a series of data write operations to a flash memory device at high speed and a method for performing a series of data write operations to a flash memory device at high speed.

DESCRIPTION OF THE PRIOR ART

In recent years, flash memory devices, particularly NAND type flash memory devices, have come into wide use as semiconductor memory devices for memory cards, silicon disks and the like. In such a NAND type flash memory device, although a transition from an erased state (logical value="1") to a programmed state (logical value="0") can be performed for each memory cell as an individual unit, a transition from the programmed state (0) to the erased state (1) cannot be performed for each memory cell as an individual unit. Such a transition from the programmed state to the erased state can be only performed for a predetermined number of memory cells as a unit, called a "block", constituted of a plurality of memory cells. Such an operation is called "block erasing".

According to the NAND type flash memory device, because the transition from the programmed state (0) to the erased state (1) cannot be performed for each memory cell as an individual unit, in order to write data into a certain block, it is required to perform a block erasing operation to change the states of all memory cells included in the block to the erased state (1). A block-erased block becomes a free block in which no data are stored. In order to write new data into a flash memory device, a search is made for such a free block and the new data are written into a found free block. Each block is constituted of a plurality of "pages" each of which is an access unit for data reading and data writing.

The data writing for the flash memory device is performed as follows:

First, when a data writing request is issued from a host computer and the address and the data to be written are transferred, the data is temporarily stored in a buffer memory provided in a controller. Then, the controller transfers the data temporarily stored in the buffer memory to the flash memory device and requests the flash memory device to store it in the page designated by the address. In response, the flash memory device stores the data transferred from the controller in the designated page. This completes data write operation.

The established practice is for the host computer to treat the pages in the same block as assigned the successive addresses. Most of the data writing requests from the host computer are directed to a plurality of successive addresses. In this case, it is necessary for the controller to write data successively to the plurality of successive pages in certain block.

Specifically, the controller transfers the data to be stored in the first page to the flash memory device and requests the flash memory device to store the data into this page. When the flash memory device has stored the transferred data into the designated page in response to this operation, the controller transfers the data to be stored in the next page to the flash memory device and requests the flash memory device to store the data into this page. When such operations have been successively performed for the plurality of requested addresses, the series of data write operations for the plurality of successive addresses is complete.

The data write operation for one page requires a predetermined operation time which is constituted of the time for transmitting the data to be stored from the controller to the flash memory device (data transmission period), the time for issuing a data write command from the controller to the flash memory device (command issuing period), the time for actually storing the data in the flash memory device (flash programming period), and so forth, Among these time periods, the flash programming period is particularly long (about 200 μsec for example).

In the prior art, when the data write request for the plurality of successive addresses is issued from the host computer, a time substantially proportional to the number of pages into which the data are to be stored is required to complete the series of data write operations because data write a series of operations each requiring a relatively long time must be successively performed.

A need has therefore been felt for a memory controller, a flash memory system and a method for controlling a flash memory device that can perform a series of data write operations fast when the data write request for the plurality of successive addresses is issued from the host computer.

It is therefore an object of the present invention to provide a memory controller that can perform a series of data write operations for the flash memory device fast and a flash memory system employing such a memory controller.

Another object of the present invention is to provide a method for controlling a flash memory device that can perform a series of data write operations for the flash memory device fast.

SUMMARY OF THE INVENTION

The above and other objects of the present invention can be accomplished by a memory controller for accessing a memory having a plurality of physical blocks based on a host address supplied from a host computer, comprising: means for dividing the physical blocks into a plurality of groups; means for forming a plurality of virtual blocks by virtually combining a plurality of physical blocks each of which belongs to a different group; and means for assigning adjacent host addresses to different physical blocks belonging to the same virtual block.

According to the present invention, when an access request for a plurality of successive host addresses is issued from the host computer, different physical blocks are accessed by the addresses because adjacent host addresses are assigned to different physical blocks in the virtual block. Thus, the physical blocks to be accessed can independently operate so that a set of operations can be executed in parallel. Therefore, the set of operations for the flash memory can be performed at high speed.

In a preferred aspect of the present invention, the groups are divided according to memory chips.

According to this preferred aspect of the present invention, because the physical blocks are divided according to the memory chips, the physical blocks associated with the plurality of successive host addresses belong to different memory chips from one another. Therefore, even if the memory chips are of an ordinary type that cannot perform a parallel operation, parallel operation can nevertheless be achieved by operating the physical blocks independently.

In a further preferred aspect of the present invention, the groups are divided according to banks.

According to this preferred aspect of the present invention, because the physical blocks are divided according to banks, the physical blocks associated with the plurality of successive host addresses belong to different banks. Therefore, even if the number of memory chip is only one, parallel operation can nevertheless be achieved by operating the banks independently. Particularly, in case of virtually combining a plurality of physical blocks belonging to different banks using a plurality of memory chips to form the virtual blocks, the set of operations for the flash memory can be performed at high speed because many more operations can be executed in parallel.

In a further preferred aspect of the present invention, the memory controller further comprises means, responsive to a data writing request issued from the host computer based on a plurality of successive host addresses, for successively transferring data to the memory including the plurality of physical blocks assigned successive host addresses and belonging to the same virtual block, and means for requesting the memory substantially at the same time to store the data into associated physical blocks.

According to this preferred aspect of the present invention, because the data write operations for storing the transferred data are requested substantially at the same time for all data, the set of operations can be performed at high speed.

The above and other objects of the present invention can be also accomplished by a memory controller for converting a host address supplied from a host computer into an internal address and accessing a memory having a plurality of physical blocks based on the internal address, characterized in that, based on at least a portion including the least significant bit of the host addresses, the memory controller converts successive host addresses supplied from the host computer into internal addresses whose associated physical blocks are different from one another.

According to the present invention, because the memory controller converts the supplied successive host addresses into internal addresses whose associated physical blocks are different from one another based on at least the portion including the least significant bit of the host addresses, at least the physical blocks associated with adjacent host addresses are invariably different. Therefore, the physical blocks accessed by the successive host addresses can independently operate so that the set of operations for the flash memory can be performed at high speed.

In a preferred aspect of the present invention, the physical blocks accessed by the internal addresses associated with the different physical blocks belong to different memory chips from one another.

According to this preferred aspect of the present invention, because the physical blocks accessed by the internal addresses associated with the different physical blocks belong to different memory chips from one another, the physical blocks associated with successive host addresses invariably belong to different memory chips. Therefore, even if the memory chips are of an ordinary type that cannot perform a parallel operation, parallel operation can nevertheless be achieved by operating the physical blocks independently.

In another preferred aspect of the present invention, the physical blocks accessed by the internal addresses associated with the different physical blocks belong to different banks from one another in the same memory chip.

According to this preferred aspect of the present invention, because the physical blocks accessed by the internal addresses associated with the different physical blocks belong to different banks from one another in the same memory chip, the physical blocks associated with successive host addresses invariably belong to different banks in the same memory chip. Therefore, even if the number of memory chips is only one, parallel operation can nevertheless be achieved by operating the banks independently.

In a further preferred aspect of the present invention, the physical blocks accessed by the internal addresses associated with the different physical blocks belong to different banks from one another in a plurality of memory chips from one another.

According to this preferred aspect of the present invention, because the physical blocks accessed by the internal addresses associated with the different physical blocks belong to different banks from one another in a plurality of memory chips from one another, many more operations can be executed in parallel by operating the banks in each memory chip independently.

The above and other objects of the present invention can be also accomplished by a memory controller for converting a host address supplied from a host computer into an internal address and accessing a memory having a plurality of physical blocks based on the internal address, characterized in that the memory controller converts a first host address into an internal address associated with a first physical block, converts a second host address following the first host address into an internal address associated with a second physical block, and converts a third host address following the second host address into an internal address associated with a physical block different from the second physical block.

According to the present invention, because the first, second and third host addresses are converted into internal addresses associated with the first physical block, second physical block and the physical block different from the second physical block, the physical blocks associated with the plurality of successive host addresses belong to different memory chips from one another. Therefore, even if the memory chips are of an ordinary type that cannot perform a parallel operation, parallel operation can nevertheless be achieved by operating the memory chips independently.

In a preferred aspect of the present invention, the physical block different from the second physical block is a third physical block and the first to third physical blocks belong to different memory chips from one another.

According to this preferred aspect of the present invention, even if the memory chips are not of an ordinary type that cannot perform a parallel operation, parallel operation can nevertheless be achieved by operating the memory chips independently.

In another preferred aspect of the present invention, the physical block different from the second physical block is a third physical block and the first to third physical blocks belong to different banks from one another in the same memory chip.

According to this preferred aspect of the present invention, even if the number of memory chips is only one, parallel operation can nevertheless be achieved by operating the banks independently.

In still another preferred aspect of the present invention, the physical block different from the second physical block is a third physical block and the first and second physical blocks belong to different banks from each other in the same memory chip and the third physical block belongs to a different memory chip from said memory chip.

According to this preferred aspect of the present invention, many more operations can be executed in parallel by operating the banks in each memory chip independently.

The above and other objects of the present invention can be also accomplished by a flash memory system comprising a flash memory having a plurality of physical blocks and a memory controller accessing the flash memory based on a host address supplied from a host computer, the memory controller comprising means for dividing the physical blocks into a plurality of groups; means for forming a plurality of virtual blocks by virtually combining a plurality of physical blocks each of which belongs to a different group; and means for assigning adjacent addresses to different physical blocks belonging to the same virtual block.

In a preferred aspect of the present invention, each of the physical blocks has a user area and a redundant area in which information specifying the virtual block to which the redundant area belongs is stored.

In a further preferred aspect of the present invention, the flash memory and the memory controller are enclosed in the same package.

In a preferred aspect of the present invention, the package is card-shaped.

The above and other objects of the present invention can be also accomplished by a flash memory system comprising a flash memory having a plurality of physical blocks constituted of a plurality of physical pages and a memory controller accessing the flash memory based on a host address supplied from a host computer, the memory controller converting a first host address into an internal address associated with a physical page assigned a page number univocally specified by the first host address belonging to a first physical block and converting a second host address following the first host address into an internal address associated with a physical page assigned the page number belonging to a second physical block.

According to the present invention, because the first and second host addresses are converted into the internal addresses associated with physical pages belonging to different physical blocks, when the access request for the successive host addresses is issued from the host computer, the set of operations can be performed at high speed by operating the accessed physical blocks independently.

In a preferred aspect of the present invention, the memory controller stores information associating the first physical block with the second physical block.

According to this preferred aspect of the present invention, because the memory controller stores information associating the first physical block with the second physical block, the memory controller can convert the host address into the internal address at high speed by referring to the information.

In a preferred aspect of the present invention, the first physical block stores information associating it with the second physical block and the second physical block stores information associating it with the first physical block.

According to this preferred aspect of the present invention, the memory controller can easily ascertain that the first and second physical blocks are associated with each other by referring to the information stored in these physical blocks.

The above and other objects of the present invention can be also accomplished by a method for controlling a flash memory device, comprising a step, responsive to a data writing request issued from a host computer based on a plurality of successive host addresses, for successively transferring data to a memory device including a plurality of physical blocks assigned successive host addresses and belonging to the same virtual block and a step for requesting the memory device substantially at the same time to store the data in associated physical blocks.

According to the present invention, because the data write operations for storing the transferred data are requested substantially at the same time for all data, the set of data write operations can be performed at high speed.

The above and other objects of the present invention can be also accomplished by a method for controlling a flash memory device having a plurality of physical blocks each of which is classified in one of a plurality of groups, comprising a step for reading virtual block numbers stored in the plurality of physical blocks, a step for virtually combining a plurality of physical blocks belonging to different groups from one another whose read virtual block numbers are coincident with one another and a step for treating the virtually combined physical blocks as a single virtual block.

According to the present invention, because a plurality of physical blocks belonging to different groups from one another in which its virtual block numbers are coincident with one another are virtually combined and these physical blocks are treated as a single virtual block, a plurality of host addresses essentially associated with the same physical block can be assigned to different physical blocks from one another. Therefore, the set of operations can be performed at high speed.

In a preferred aspect of the present invention, the groups are divided according to memory chips.

In a further preferred aspect of the present invention, the groups are divided according to banks.

BRIEF DESCRIPTION OF THE DRAWINGS

FIG. 7 is a schematic diagram showing the virtual page structure of the virtual block shown in FIG. 6.

FIG. 8 is a schematic diagram showing the data structure of an address translation table 27 indicating the relationship between each of 8000 virtual blocks and 4 physical blocks forming the virtual block.

FIG. 9 is a schematic diagram showing the data structure of an erased block queue 30 stored in a SRAM work area 8.

FIG. 17 is a schematic diagram showing the virtual page structure of the virtual block shown in FIG. 16.

FIG. 18 is a schematic diagram showing the data structure of an address translation table 33 indicating the relationship between each of 8000 virtual blocks and 4 physical blocks forming the virtual block.

FIG. 25 is a schematic diagram showing the data structure of an address translation table 36 indicating the relationship between each of 4000 virtual blocks and 8 physical blocks forming the virtual block.

FIG. 26 is a schematic diagram showing the data structure of an erased block queue 37 stored in the SRAM work area 8.

DESCRIPTION OF THE PREFERRED EMBODIMENT

A preferred embodiment of the present invention will be explained in detail with reference to the drawings.

Figure 1:
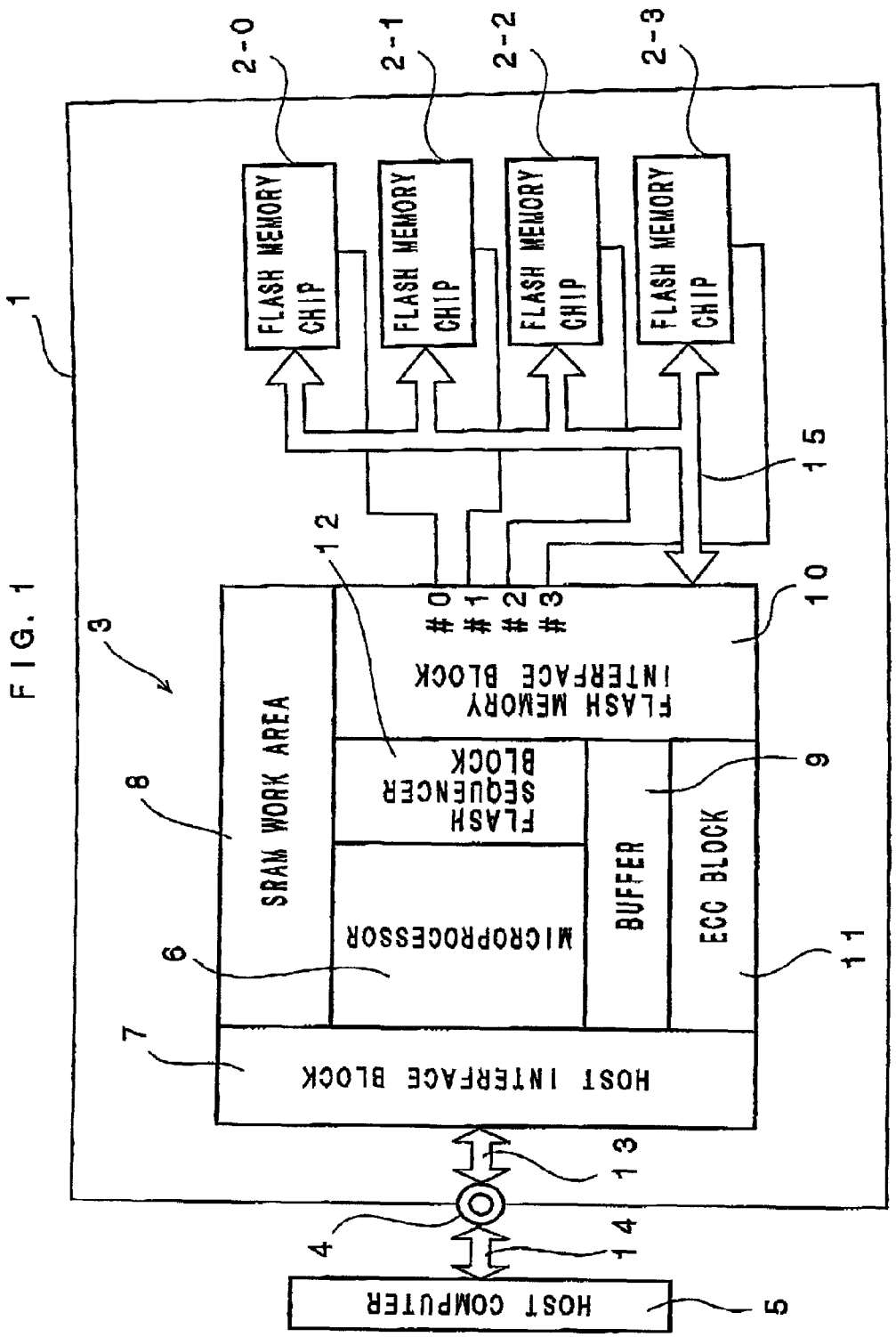
FIG. 1 is a schematic block diagram showing a flash memory system 1 that is a preferred embodiment of the present invention.

FIG. 1 is a schematic block diagram showing a flash memory system 1 that is a preferred embodiment of the present invention.

As shown in FIG. 1, the flash memory system 1 has the shape of a card, and is composed of four flash memory chips 2-0 to 2-3, a controller 3, and a connector 4, each of which is integrated into the card. The flash memory system 1 can be removably attached to a host computer 5 for use as a kind of an external storage device for the host computer 5. The host computer 5 can be any of various types and, for example, can be a personal computer for processing various information such as text data, sound data, and visual data or can be the computer of a digital still camera.

Each flash memory chip 2-0 to 2-3 is a semiconductor chip having a capacity of 128M bytes (1G bits), for example. In the flash memory system 1, each page, which is a minimum access unit, is composed of 512 bytes for storing user data. Thus, the address space of each flash memory chip 2-0 to 2-3 includes 256K pages, and the amount of address space of the flash memory chips 2-0 to 2-3 is 1M pages. In the flash memory system 1, these four flash memory chips 2-0 to 2-3 are treated as a big single memory having a capacity of 512M bytes (4G bits) and 1M pages of address space. Address information of 20-bit length is required to access such a memory having 1M pages of address space. Thus, to access an individual page, the host computer 5 supplies address information of 20-bit length to the flash memory system 1. Such address information of 20-bit length supplied from the host computer 5 to the flash memory system 1 is referred to as a "host address".

The controller 3 is composed of a microprocessor 6, a host interface block 7, a SRAM (static random access memory) work area 8, a buffer 9, a flash memory interface block 10, an ECC (error correction code) block 11, and a flash sequencer block 12. These functional blocks composing the controller 3 are integrated in a single semiconductor chip.

The microprocessor 6 is a functional block that controls the operations of each functional block composing the controller 3.

The host interface block 7 is connected to the connector 4 via a bus 13 to send or receive data, address information, status information, and external command information to/from the host computer 5 under the control of the microprocessor 6. Specifically, when the flash memory system 1 is attached to the host computer 5, the flash memory system 1 and the host computer 5 are electrically connected to each other via the bus 13, the connector 4, and a bus 14. When the electrical connection between the flash memory system 1 and the host computer 5 is established, various information such as data supplied from the host computer 5 to the flash memory system 1 is input to the controller 3 via the host interface block 7 serving as an input section, and various information such as data supplied from the flash memory system 1 to the host computer 5 is output from the controller 3 via the host interface block 7 serving as an output section. Further, the host interface block 7 employs task file registers (not shown) temporarily storing the host address and the external commands from the host computer 5 and error registers (not shown) which are set in response to error occurrence.

The SRAM work area 8, composed of a plurality of SRAM cells, is a working area for temporarily storing data used by the microprocessor 6 for controlling the flash memory chips 2-0 to 2-3.

The buffer 9 is for temporarily storing data read from the flash memory chips 2-0 to 2-3 and data to be written into the flash memory chips 2-0 to 2-3. Specifically, data read from the flash memory chips 2-0 to 2-3 are temporarily stored in the buffer 9 until the host computer 5 is ready to receive them, and data to be written into the flash memory chips 2-0 to 2-3 are temporarily stored in the buffer 9 until the flash memory chips 2-0 to 2-3 are ready to be written.

The flash memory interface block 10 is a functional block for sending or receiving data, address information, status information, and internal command information to/from the flash memory chips 2-0 to 2-3 via a bus 15 and for supplying the chip selection signals #0 to #3 to the flash memory chips 2-0 to 2-3. One of chip selection signals #0 to #3 is activated based on the upper two bits of the host address supplied from the host computer 5 when a data read operation or a data write operation is requested by the host computer 5. Specifically, the chip selection signal #0 is selectively activated based on the upper two bits of the host address being "00", the chip selection signal #1 is selectively activated based on the upper two bits of the host address being "01", the chip selection signal #2 is selectively activated based on the upper two bits of the host address being "10", and the chip selection signal #3 is selectively activated based on the upper two bits of the host address being "11". Each of the chip selection signals #0 to #3 activates a corresponding flash memory chip 2-0 to 2-3 to allow the data read operation and the data write operation to be performed. It is noted that the "internal command information" is distinguished from the "external command information": the internal command information is issued from the controller 3 to control the flash memory chips 2-0 to 2-3; the external command information is issued from the host computer 5 to control the flash memory system 1.

The ECC block 11 is a functional block for generating an error correction code to be added to data to be written to the flash memory chips 2-0 to 2-3 and to correct any error included in data read from the flash memory chips 2-0 to 2-3.

The flash sequencer block 12 is a functional block for controlling data transfer between the flash memory chips 2-0 to 2-3 and the buffer 9. The flash sequencer block 12 has a plurality of registers (not shown). When a certain value necessary for reading data from the flash memory chips 2-0 to 2-3 or to write data into the flash memory chips 2-0 to 2-3 is set in the registers (not shown) under the control of the microprocessor 6, the flash sequencer block 12 performs certain operations necessary to read data or to write data.

Next, the physical structure of each of the flash memory cells included in the flash memory chips 2-0 to 2-3 will be explained.

Figure 2:
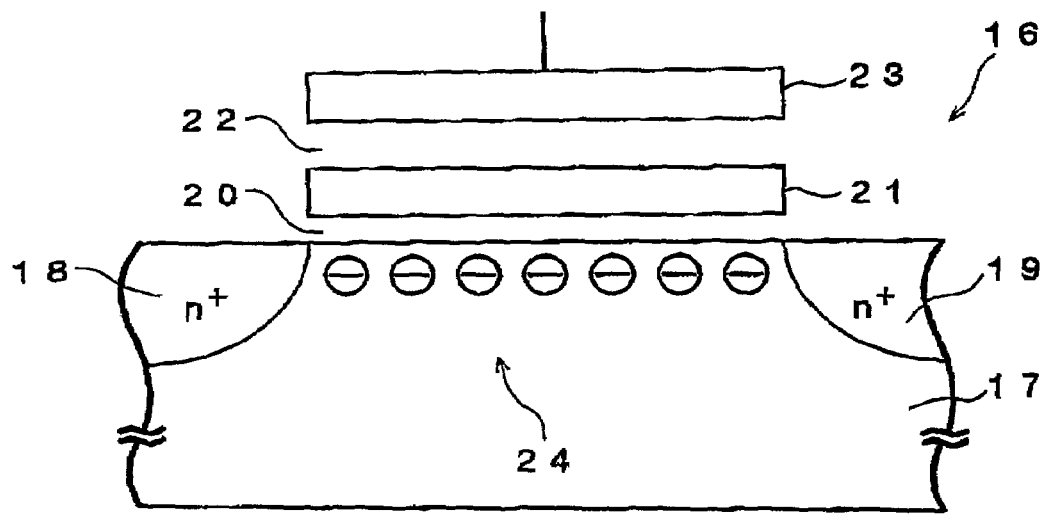
FIG. 2 is a schematic sectional diagram showing a cross-section of a flash memory cell 16 included in flash memory chips 2-0 to 2-3 shown in FIG. 1.

FIG. 2 is a schematic sectional diagram showing a cross-section of a flash memory cell 16 included in the flash memory chips 2-0 to 2-3.

As shown in FIG. 2, the flash memory cell 16 is composed of a semiconductor substrate 17 of p-type, source and drain diffusion regions 18 and 19 of n-type each of which is formed in the semiconductor substrate 17, a tunnel oxide film 20 formed on a part of the semiconductor substrate 17 located between the source and drain diffusion regions 18 and 19, a floating gate electrode 21 formed on the tunnel oxide film 20, an insulating film 22 formed on the floating gate electrode 21, and a control gate electrode 23 formed on the insulating film 22. In the flash memory chips 2-0 to 2-3, pluralities of the flash memory cells 16 having the above-mentioned structure are serially connected to form a flash memory of NAND type.

The flash memory cell 16 exhibits either an "erased state" or a "programmed state" depending on whether electrons are injected into the floating gate electrode 21. The flash memory cell 16 being in the erased state indicates that the data stored therein is "1", and the flash memory cell 16 being in the programmed state indicates that the data stored therein is "0". That is, each flash memory cell 16 can store one bit of digital data.

As shown in FIG. 2, in the erased state, substantially no electrons are injected into the floating gate electrode 21. In the erased state, the flash memory cell 16 becomes a transistor of depletion type so that a channel 24 appears at the surface of the semiconductor substrate 17 of p-type located between the source and drain diffusion regions 18 and 19 regardless of whether reading voltage is being applied to the control gate electrode 23. Therefore, the source and drain diffusion regions 18 and 19 are electrically connected to each other by the channel 24 regardless of whether reading voltage is being applied to the control gate electrode 23.

Figure 3:
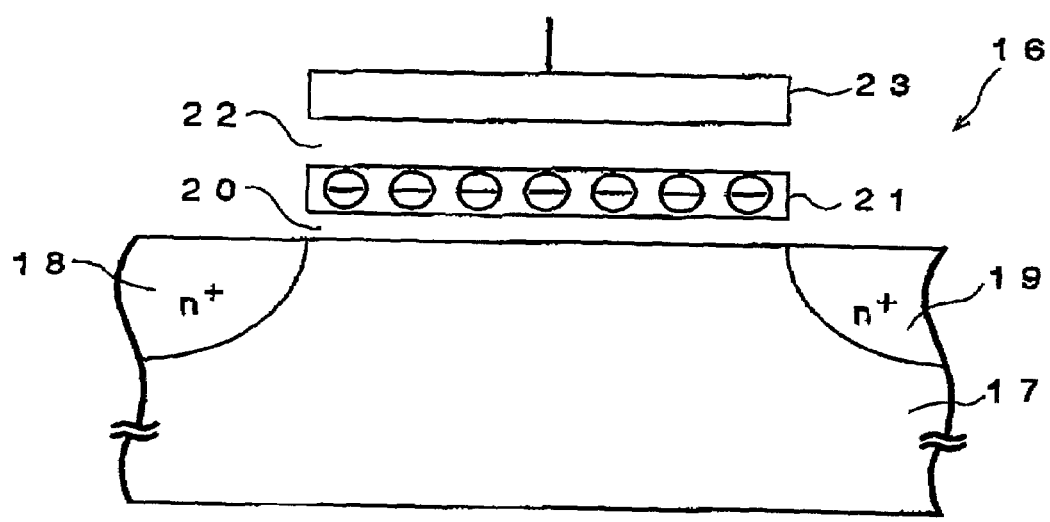
FIG. 3 is a schematic sectional diagram showing a cross-section of the flash memory cell 16 in the programmed state.

FIG. 3 is a schematic sectional diagram showing a cross-section of the flash memory cell 16 in the programmed state.

As shown in FIG. 3, in the programmed state, electrons are injected into the floating gate electrode 21. The electrons injected into the floating gate electrode 21 stay therein for an extremely long period because the floating gate electrode 21 is sandwiched between the tunnel oxide film 20 and the insulating film 22. In the programmed state, the flash memory cell 16 becomes a transistor of enhancement type. Thus, when reading voltage is not applied to the control gate electrode 23, no channel is induced at the surface of the semiconductor substrate 17 of p-type located between the source and drain diffusion regions 18 and 19. On the other hand, when reading voltage is applied to the control gate electrode 23, a channel (not shown) is induced at the surface of the semiconductor substrate 17 of p-type located between the source and drain diffusion regions 18 and 19. Therefore, when reading voltage is not applied to the control gate electrode 23, the source and drain diffusion regions 18 and 19 are electrically isolated from each; when reading voltage is applied to the control gate electrode 23, the source and drain diffusion regions 18 and 19 are electrically connected to each other.

It can be detected whether the flash memory cell 16 is in the erased state or the programmed state by the following steps. First, reading voltage is applied to every control gate electrode 23 of the flash memory cells 16 except for a selected flash memory cell 16, so that the flash memory cells 16 are serially connected to form a serial circuit. Next, it is detected whether or not current can flow through the serial circuit. Then, the state of the selected flash memory cell 16 is judged to be in the erased state if current can flow through the serial circuit, and the state of the selected flash memory cell 16 is judged in the programmed state if current cannot flow through the serial circuit. In this manner, the data stored in each flash memory cell 16 can be detected as to whether "0" or "1." In the flash memory of NAND type, however, two or more data stored in flash memory cells 16 which belong to the same serial circuit cannot be read out simultaneously.

To change the state of the flash memory cell 16 from the erased state to the programmed state, high positive voltage is applied to the control gate electrode 23 to inject electrons into the floating gate electrode 21 via the tunnel oxide film 20. The injection of the electrons into the floating gate electrode 21 can be performed using an F-N tunnel current. On the other hand, to change the state of the flash memory cell 16 from the programmed state to the erased state, high negative voltage is applied to the control gate electrode 23 to eject the previously injected electrons from the floating gate electrode 21 via the tunnel oxide film 20.

Next, the specific structure of the address space of each of the flash memory chips 2-0 to 2-3 will be explained.

Figure 4:
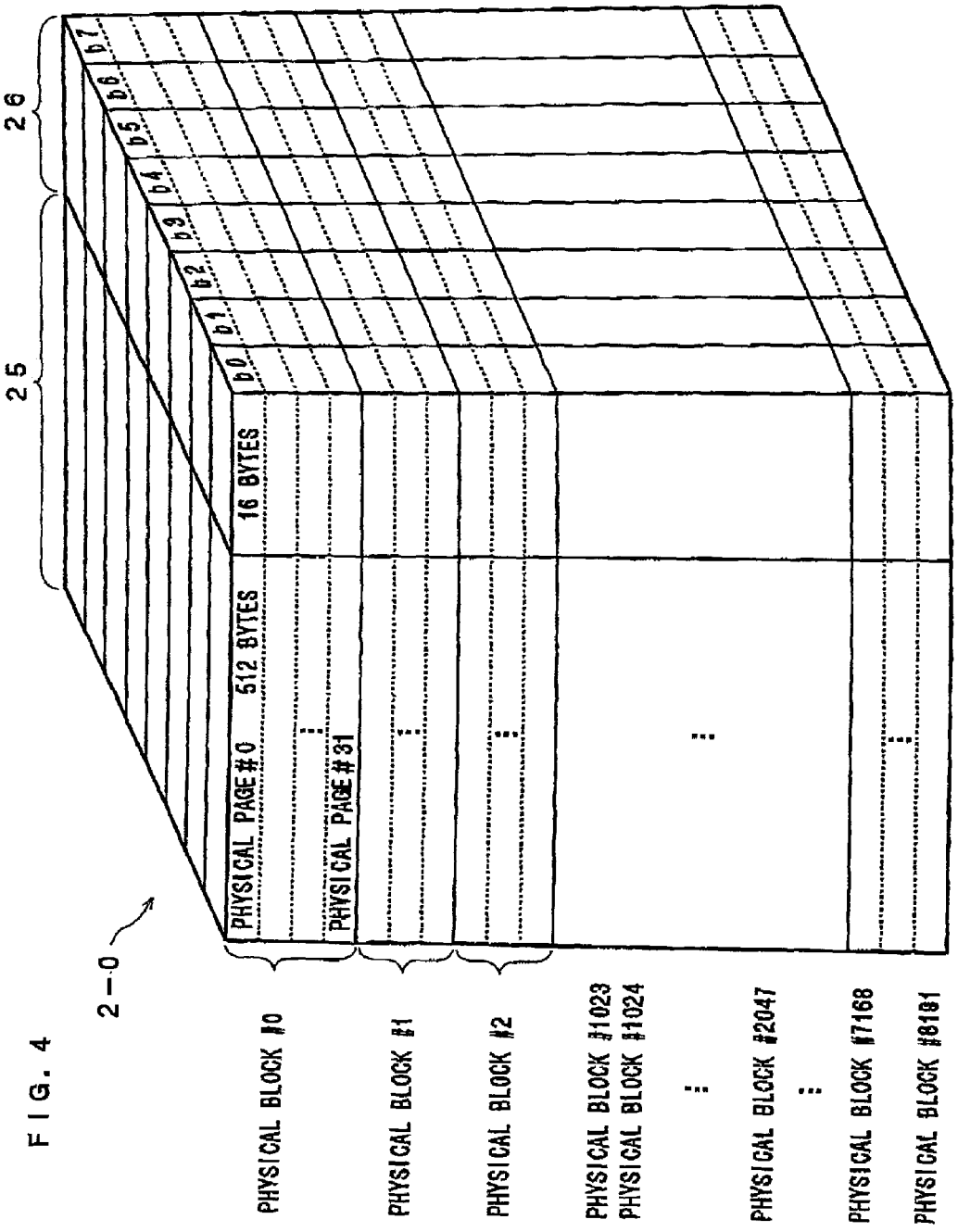
FIG. 4 is a schematic diagram showing the structure of the address space of the flash memory chip 2-0.

FIG. 4 is a schematic diagram showing the structure of the address space of the flash memory chip 2-0.

As shown in FIG. 4, the address space of the flash memory chip 2-0 is divided into 8192 physical blocks composed of physical blocks #0 to #8191. Although not shown in FIG. 4, each of the address spaces of the flash memory chips 2-1 to 2-3 is also divided into 8192 physical blocks composed of blocks #0 to #8191. Each physical block has a memory capacity of 16K bytes.

Each physical block is a unit of block erasing. In other words, in the flash memory chips 2-0 to 2-3, the state of each flash memory cell 16 cannot be changed from the programmed state to the erased state in cell units. To change the state of the flash memory cell 16 from the programmed state to the erased state, it is required to change the states of all flash memory cells 16 of the physical block including the flash memory cells 16 to be erased. In contrast, the state of each flash memory cell 16 can be changed from the erased state to the programmed state in cell units.

Further, as shown in FIG. 4, each physical block #0 to #8191 composing the flash memory chip 2-0 is divided into 32 physical pages composed of physical pages #0 to #31. Similarly to the physical blocks #0 to #8191 composing the flash memory chip 2-0, each physical block #0 to #8191 composing the flash memory chips 2-1 to 2-3 is also divided into 32 physical pages.

Each of the physical pages is an access unit during the data read operation and the data write operation and is composed of a user area 25 of 512 bytes and a redundant area 26 of 16 bytes, where 1 byte is equal to 8 bits composed of bits b0 to b7. The user area 25 is an area for storing user data supplied from the host computer 5.

Figure 5:
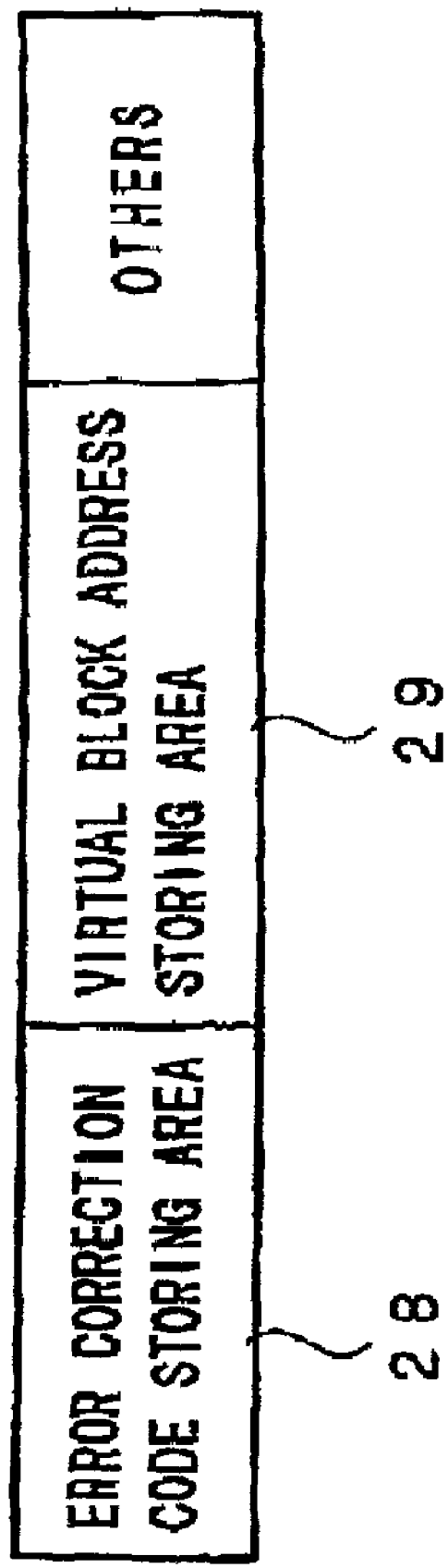
FIG. 5 is a schematic diagram showing the data structure of a redundant area 26.

FIG. 5 is a schematic diagram showing the data structure of the redundant area 26.

As shown in FIG. 5, the redundant area 26 is composed of an error correction code storing area 28, a virtual block address storing area 29, and an area for storing other additional information.

The error correction code storing area 28 is an area for storing additional information (error correction code) for correcting errors included in the user data stored in the corresponding user area 25. User data including less than a predetermined number of errors can be completely corrected by using the error correction code.

The virtual block address storing area 29 is an area for storing an address of the virtual block (virtual block address) including this physical block. Details of the virtual block and the virtual block address are explained later.

The remaining area of the redundant area 26 is an area for storing a block status indicating, for example, a defect of the physical block. However, no explanation will be given here regarding the information stored in the remaining area of the redundant area 26.

Because each page is composed of the user area 25 of 512 bytes and the redundant area 26 of 16 bytes as described above, each page includes 8×(512 bytes+16 bytes)=4224 flash memory cells.

Among the 8192 physical blocks in each flash memory chip 2-0 to 2-3, 8000 physical blocks are used as "actual use blocks" which can store user data and the remaining 192 physical blocks are used as "redundant blocks." The redundant blocks are free blocks which are used in the data write operation. The address space of the flash memory chips 2-0 to 2-3 is formed by only the actual use blocks. If defects arise in one or more physical blocks so that the physical blocks become defective blocks, the number of redundant blocks is decreased by the number of the defective blocks.

Four actual use blocks each selected from different flash memory chips 2-0 to 2-3 constitute "a virtual block" in which the four actual use blocks are virtually combined. Therefore, a maximum of 8000 virtual blocks composed of virtual blocks #0 to #7999 are formed.

Figure 6:
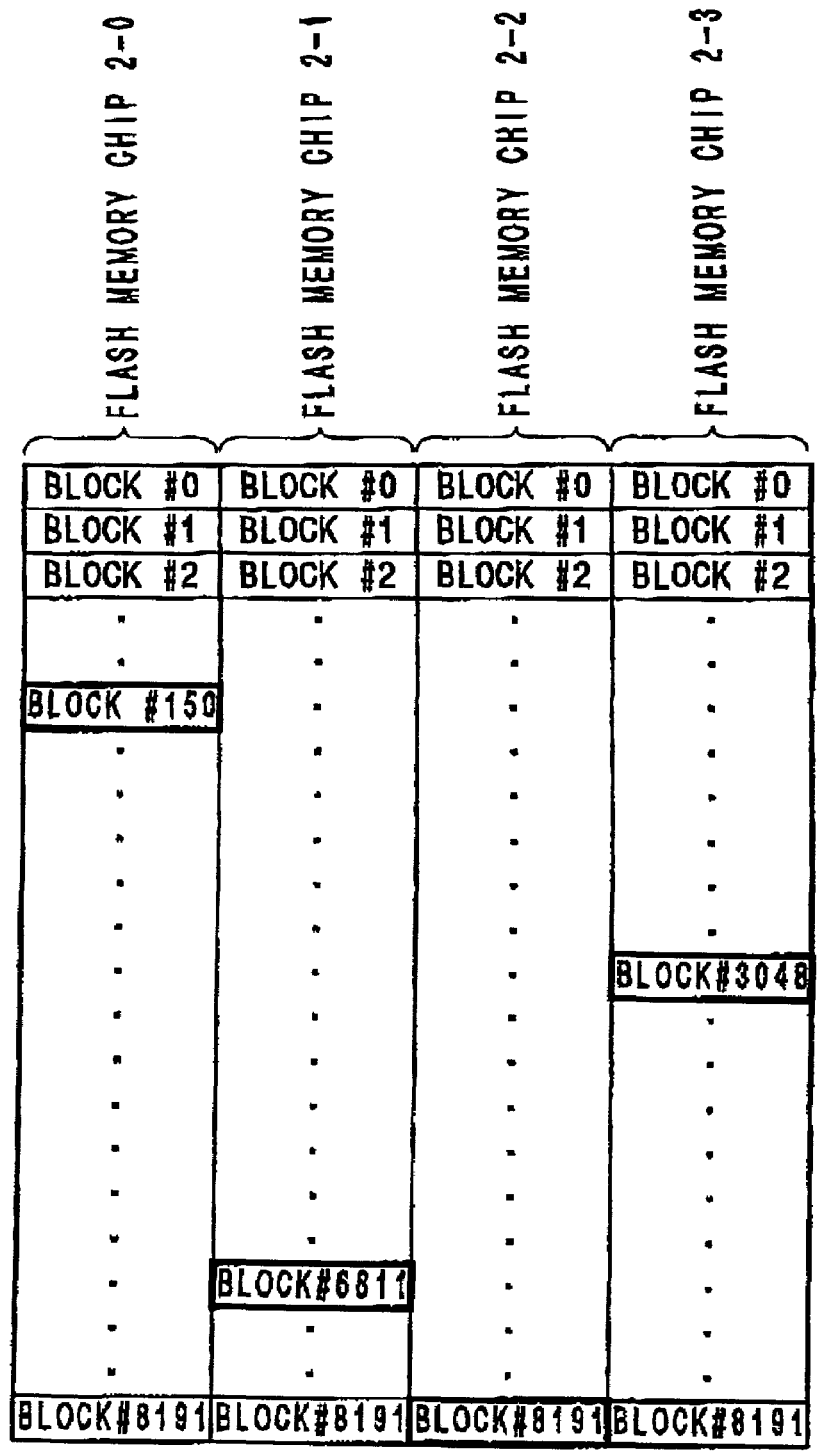
FIG. 6 is a schematic diagram showing a mapping example of a virtual block in a preferred embodiment of the present invention.

FIG. 6 is a schematic diagram showing a mapping example of the virtual block.

In the mapping example shown in FIG. 6, the physical block #150 in the flash memory chip 2-0, the physical block #6811 in the flash memory chip 2-1, the physical block #8191 in the flash memory chip 2-2, and the physical block #3048 in the flash memory chip 2-3 are virtually combined to form one virtual block. In this embodiment, the four physical blocks constituting one virtual block are required to belong to different flash memory chips from one another. Thus, a maximum of 8000 virtual blocks are constituted.

FIG. 7 is a schematic diagram showing the structure of the virtual pages constituting the virtual block shown in FIG. 6.

As shown FIG. 7, the virtual block is treated as single block constituted of 128 virtual pages consisting of the virtual pages #0 to #127. The 32 physical pages contained in the portion constituted by the physical block #150 are assigned virtual page numbers #$4i$ (i representing a physical page number) as; the 32 physical pages contained in the portion constituted by the physical block #6811 are assigned virtual page numbers #$4i+1$; the 32 physical pages contained in the portion constituted by the physical block #8191 are assigned virtual page numbers #$4i+2$; and the 32 physical pages contained in the portion constituted by the physical block #3048 are assigned virtual page numbers #$4i+3$. Details are explained later but these virtual page numbers correspond to the lower 7 bits of the host address.

The relationship between a virtual block and the four physical blocks constituting the virtual block will now be explained.

FIG. 8 is a schematic diagram showing the data structure of an address translation table 27 indicating the relationship between each of 8000 virtual blocks and the 4 physical blocks forming the virtual block.

As shown in FIG. 8, the address translation table 27 has 8000 virtual block indicating areas consisting of the virtual block indicating areas #0 to #7999 arranged in this order. Each virtual block indicating area is constituted of four cells consisting of the cells #j-0 to #j-3 (j representing a virtual block address) and one flag. For example, the virtual block indicating area #0 is constituted of the cells #0-0 to #0-3 and the flag; the virtual block indicating area #1 is constituted of the cells #1-0 to #1-3 and the flag. Thus, the address translation table 27 includes 32000 cells and 8000 flags. A slot #0 which is constituted of the cells #j-0 corresponds to the flash memory chip 2-0; a slot #1 which is constituted of the cells #j-1 corresponds to the flash memory chip 2-1; a slot #2 which is constituted of the cells #j-2 corresponds to the flash memory chip 2-2; and a slot #3 which is constituted of the cells #j-3 corresponds to the flash memory chip 2-3.

The addresses of the physical blocks constituting the virtual blocks (physical block addresses) are stored in the corresponding cells #j-0 to #j-3. The physical block address indicates the block number assigned to the corresponding physical block using 13 bits in binary code. For example, assuming that the virtual block shown in FIGS. 6 and 7 is the virtual block #0, "0000010010110B", "1101010011011B", "1111111111111B", and "0101111101000B" are stored in the cells #0-0 to #0-3 as the physical block addresses, because the virtual block #0 is constituted of the physical blocks #150, #6811, #8191, and #3048.

The flag included in each virtual block indicating area indicates whether the content of the corresponding cell is valid or invalid. Specifically, when the flag indicates "1", the content of the corresponding cell is valid; and when the flag indicates "0", the content of the corresponding cell is invalid. Therefore, the content of the cells #j-0 to #j-3 where the corresponding flag indicates "0" is invalid.

The address translation table 27 having the above-described structure is stored in the SRAM work area 8.

As described above, the address translation table 27 is constituted of 32000 cells each storing 13 bits of data and 8000 flags each storing 1 bit of data. The address translation table 27 therefore occupies an area of 64K bytes in the SRAM work areas 8.

The address translation table 27 is generated as follows:

In the top page (physical page #0) of each physical block constituting the flash memory chips 2-0 to 2-3 in which user data are stored, the virtual block address indicating to which virtual block the physical block belongs is stored in the redundant area 26 in addition to the error correction code generated by the ECC block 11. The virtual block address stored in the top page (physical page #0) of each physical block are read under the control of the microprocessor 6 via the flash memory interface block 10.

In an erased free block, the virtual block address stored in the virtual block address storing area 29 of the redundant area 26 should be all 1s (1111111111111B). Specifically, the virtual block addresses all fall between #0 (0000000000000B) and #7999 (1111100111111B) and, therefore, a physical block whose virtual block address is all 1s (1111111111111B) can be determined to be a free block. In other words, when the virtual block address is any one of "0000000000000B" to "1111100111111B", the virtual block address is a valid virtual block address.

In the case where the virtual block address read from the redundant area 26 of the top page (physical page #0) by the microprocessor 6 is not all 1s (1111111111111B) but a valid virtual block address, the physical block address of the physical block from which the virtual block address was read is stored in the cell designated by the chip number and the read virtual block address. For example, if the virtual block address read from the physical block #12 belonging to the flash memory chip 2-0 is "123", "12" is stored as the physical block address in the cell #123-0 and "1" is stored in the corresponding flag.

Such operations are performed for every physical block that contains user data. This completes the generation of the address translation table 27.

Next, the data structure of the erased block queue 30 stored in the SRAM work area 8 will be explained.

FIG. 9 is a schematic diagram showing the data structure of the erased block queue 30 stored in the SRAM work area 8.

As shown in FIG. 9, the erased block queue 30 is constituted of six queue sets consisting of the queue sets #0 to #5 each of which is constituted of four queues consisting of the queues #k-0 to #k-3 (k representing a queue set number). For example, the queue set #0 is constituted of the queues #0-0 to #0-3; and the queue set #1 is constituted of the queues #1-0 to #1-3. Therefore, the erased block queue 30 includes 24 queues. The queues #k-0 are associated with the flash memory chip 2-0; the queues #k-1 are associated with the flash memory chip 2-1; the queues #k-2 are associated with the flash memory chip 2-2; and the queues #k-3 are associated with the flash memory chip 2-3.

The physical block addresses of physical blocks in which all flash memory cells 16 constituting the user area 25 are in the erased state (free blocks) are stored in the queues #k-0 to #k-3 of the queue sets #0 to #5. For example, in the case where the physical block #153 which belongs to the flash memory chip 2-0 is to be registered in the erased block queue 30, the physical block address, "0000010011001B (153)" is stored in one of the queues #0-0 to #5-0. Similarly, in the case where the physical block #6552 which belongs to the flash memory chip 2-2 is to be registered in the erased block queue 30, the physical block address, "1100110011000B (6652)", is stored in one of the queues #0-2 to #5-2.

Therefore, in each flash memory chip 2-0 to 2-3 up to six physical block addresses of the free blocks are registered in the erased block queue 30. Therefore, at most six queue sets #0 to #5 are prepared.

The generation of the erased block queue 30 is performed under the control of the microprocessor 6 during the generation of the address translation table 27. The physical block addresses to be registered in the erased block queue 30 are selected from the redundant blocks awaiting the data write operation.

Next, the data read operations and data write operations of the flash memory system 1 will be explained in this order.

First, the data read operation of the flash memory system 1 will be explained by using an example.

The data read operation will be explained for the case where an external read command, a kind of external command, and a host address "00000111111111100000B", for example, are supplied from the host computer 5 to the flash memory system 1 via the bus 14, the connector 4, and the bus 13.

First, when the host address and the external read command are supplied to the controller 3, they are temporarily stored in the task file register (not shown) of the host interface block 7.

Next, the host address stored in the task file register is checked for whether it is invalid, for example, is an nonexistent address, an invalid address, or the like, by the host interface block 7.

On the one hand, when the check finds the host address stored in the task file register to be valid, the host address is converted into the internal address by using the address translation table 27. On the other hand, when the host address is found to be invalid, the error register (not shown) of the host interface block 7 is set, so that the host computer 5 can ascertain occurrence of any error by referring to the error register.

The translation method for obtaining an internal address using the address translation table 27 will be explained with reference to FIG. 10.

Figure 10:
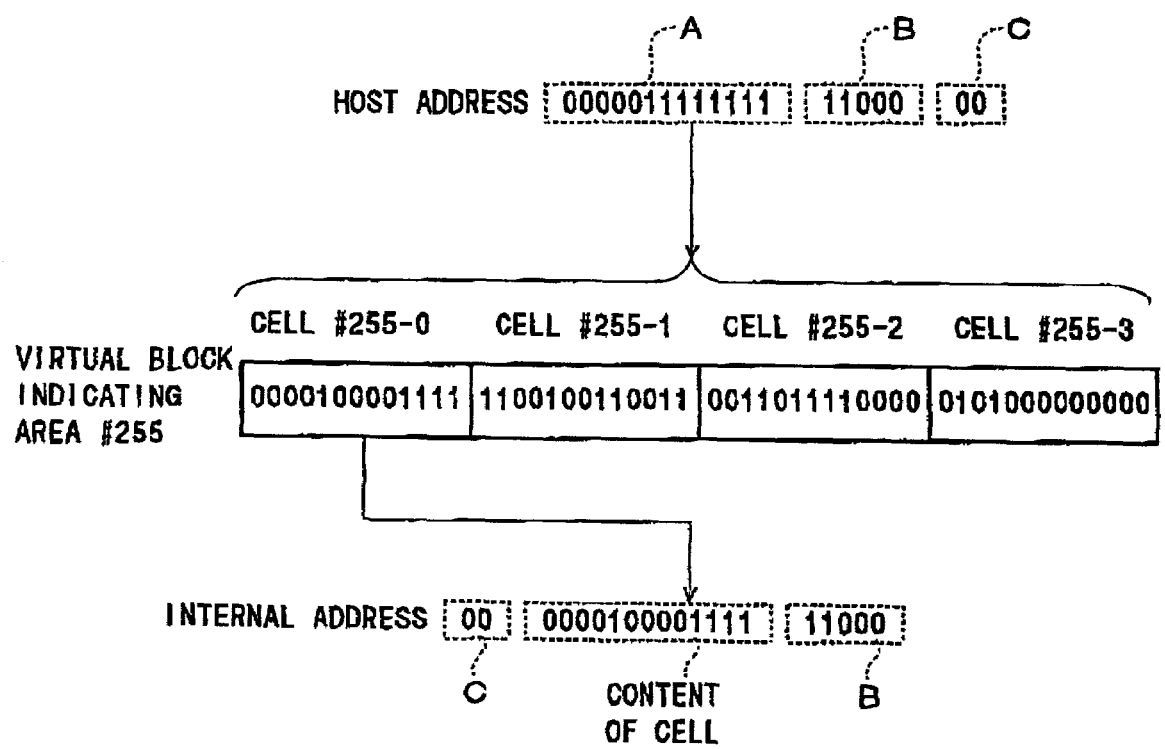
FIG. 10 is a schematic diagram showing the translation method for obtaining an internal address using the address translation table 27 during the data read operation.

In FIG. 10, for convenience, "A" is used to indicate the upper 13 bits of the host address, "B" to indicate the 5 bits composed of the upper 14th bit to the upper 18th bit of the host address, and "C" to indicate the lower 2 bits of the host address.

First, upper 13 bits (A) of the host address are extracted from the host address of 20 bits, and then one of the virtual block indicating areas constituting the address translation table 27 is selected under the control of the microprocessor 6. In the exemplified case, because the extracted 13 bits (A) of the host address are "0000001111111B (255)", the virtual block indicating area #255 is selected.

Next, the virtual block indicating area #255 is selected from the address translation table 27 stored in the SRAM work area 8, and the content of the one cell whose branch number is coincident with the lower 2 bits (C) of the host address is read out under the control of the microprocessor 6. In the exemplified case, because the lower 2 bits (C) of the host address are "00B (0)", the cell whose content is read out is the cell #255-0. As shown in FIG. 10, the content of the cell #255-0 is assumed to be "0000100001111B".

Next, the lower 2 bits (C) of the host address, the content read from the cell, and the 5 bits (B) composed of the upper 14th bit to the upper 18th bit of the host address are combined in this order. The combined address is the internal address. In the exemplified case, the lower 2 bits (C) of the host address are "00B", the content read from the cell is "0000100001111B", and the 5 bits (B) composed of the upper 14th bit to the upper 18th bit of the host address is "11000B", so that "000000100001111111000B" is obtained as the internal address as shown in FIG. 10.

This completes the address translation from the host address to the internal address.

In response to the storage of the external read command in the task file registers (not shown) included in the host interface block 7, various registers (not shown) included in the flash sequencer block 12 are set under the control of the microprocessor 6. This operation is performed as follows:

First, the internal read command, which is a kind of internal command, is set in the predetermined registers included in the flash sequencer block 12 under the control of the microprocessor 6. Further, the internal address of 20 bits is set in other registers (not shown) included in the flash sequencer block 12 under the control of the microprocessor 6.

When the above setting for the registers included in the flash sequencer block 12 is completed, the sequential data read operation is started by the flash sequencer block 12. The sequential data read operation is performed by the flash sequencer block 12 as follows:

First, the flash sequencer block 12 directs the flash memory interface block 10 to activate one of the chip selection signals #0 to #3 corresponding to the flash memory chip to be accessed based on the upper two bits of the internal address stored in the prescribed register. In the exemplified case, because the upper two bits of the internal address are "00B (0)", the flash memory chip to be accessed is the flash memory chip 2-0. Therefore, the chip selection signal #0 is activated and access to the flash memory chip 2-0 for reading data is enabled. The other chip selection signals #1 to #3 are kept in the inactive state.

Next, the flash sequencer block 12 directs the flash memory interface block 10 to send the lower 18 bits of the internal address, which are "000010000111111000B", and the internal read command stored in the prescribed registers to the bus 15. Although the lower 18 bits of the internal address and the internal read command are provided in common to the flash memory chips 2-0 to 2-3 via the bus 15, they are only valid for the flash memory chip 2-0 because the chip selection signal #0 is in the active state while the other the chip selection signals #1 to #3 are in the inactive state.

As a result, the flash memory chip 2-0 can read data stored at the lower 18 bits of the internal address "000010000111111000B". Among the lower 18 bits of the internal address, the upper 13 bits are used to select the physical block to be accessed and the lower 5 bits are used to select the physical page to be accessed included in the selected physical block. In the exemplified case, since the upper 13 bits are "0000100001111B (271)" and the lower 5 bits are "11000B (24)", the physical block #271 and the physical page #24 are selected. That is, the flash memory chip 2-0 reads data stored at the physical page #24 of the physical block #271. In this read operation, not only the user data stored in the user area 25 but also various additional information stored in the redundant area 26 are read out.

In this embodiment, because four physical blocks constitutes one virtual block as mentioned above with reference to FIG. 7, the physical page #24 of the physical block #271 which belongs to the flash memory chip 2-0 corresponds to the virtual page #96 of the virtual block #255.

By the above operations, the user data and additional information read from the flash memory chip 2-0 are supplied to the flash memory interface block 10 via the bus 15. When the flash memory interface block 10 receives the user data and additional information, the error correction code included in the additional information is extracted and the user data and the error correction code are supplied to the ECC block 11 under the control of the flash sequencer block 12. When the user data and the error correction code are supplied to the ECC block 11, the ECC block 11 judges based on the error correction code whether or not the user data includes any error. If the ECC block 11 judges that the user data does not include any error, the ECC block 11 supplies the user data unmodified to the buffer 9. If the ECC block 11 judges that the user data includes an error, the ECC block 11 corrects the user data based on the error correction code and supplies the corrected user data to the buffer 9. Then the error-free user data are temporarily stored in the buffer 9, whereby the sequential read operation by the flash sequencer block 12 is completed.

Then, the user data stored in the buffer 9 are transferred to the host computer 5 via the host interface block 7, the bus 13, the connector 4, and the bus 14 under the control of the microprocessor 6.

This completes the data read operation.

Next, the data write operations of the flash memory system 1 will be explained.

Explanations of the data write operations of the flash memory system 1 will be divided into the case of assigning new data to a host address in which no data is assigned, i.e., a new data writing, and the case of assigning new data to a host address in which different data is already assigned, i.e., a data overwriting.

First, the new data writing operation of the flash memory system 1 will be explained using an example.

The data write operation #1 will be explained for the case where the external write command, a kind of external command, the successive host addresses "00010101010101001000B" to "00010101010101001001B" in which no data are assigned, for example, and user data to be written are supplied to the flash memory system 1 via the bus 14, the connector 4, and the bus 13 from the host computer 5. Hereinafter, these successive host addresses are referred to as the host addresses #0 to #3.

First, when the host addresses #0 to #3 and the external write command are supplied to the controller 3, the host addresses #0 to #3 and the external write command are temporarily stored in the task file register (not shown) of the host interface block 7. Further, when the user data to be written are supplied to the controller 3, they are transferred to the ECC block 11 under the control of the microprocessor 6. In response to receipt of the user data, the ECC block 11 analyzes the user data to generate the error correction code and the ECC block 11 temporarily stores it. On the other hand, the user data are stored in the buffer 9.

Next, the host addresses #0 to #3 stored in the task file register are checked for whether they are invalid, for example, are nonexistent addresses, invalid addresses, or the like, by the host interface block 7.

On one hand, when the check finds the host addresses #0 to #3 stored in the task file register to be valid, the host addresses #0 to #3 are converted into the internal addresses using the address translation table 27. On the other hand, when the host addresses #0 to #3 are found to be invalid, the error register (not shown) of the host interface block 7 is set, so that the host computer 5 can ascertain occurrence of any error by referring to the error register.

When the host addresses #0 to #3 are found to be valid, they are converted into internal addresses using the address translation table 27.

Figure 11:
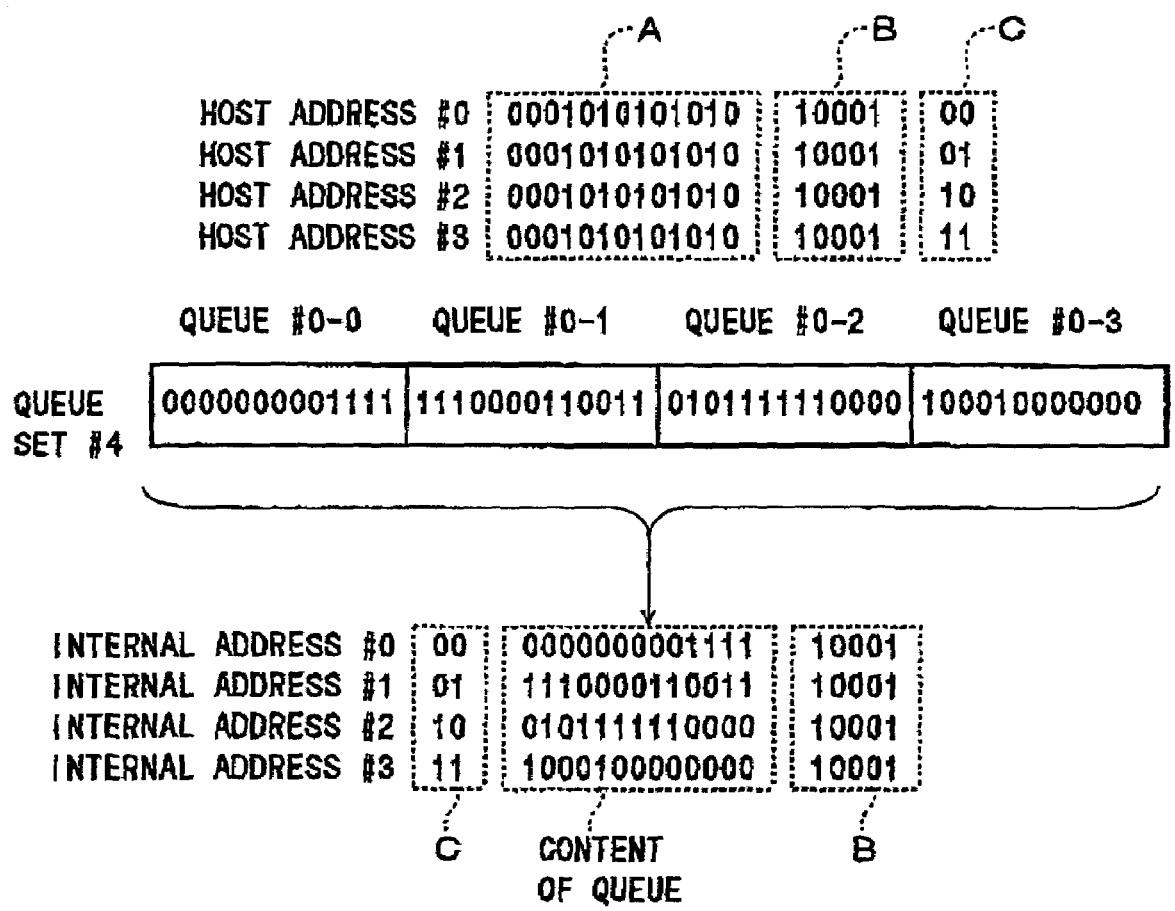
FIG. 11 is a schematic diagram showing the translation method for obtaining an internal address using the address translation table 27 during the data write operation.

FIG. 11 is a schematic diagram showing the translation method for obtaining internal addresses using the address translation table 27.

As shown in FIG. 11, in the exemplified case, because the upper 13 bits (A) of the host addresses #0 to #3 are "0001010101010B (682)", the virtual block indicating area #682 is selected.

Next, the contents of the virtual block indicating area #682 of the address translation table 27 stored in the SRAM work area 8 are read out under the control of the microprocessor 6. Because this data write operation is a new data writing operation, which is an operation for assigning new data to the host address in which no data is assigned, the flag included in the virtual block indicating area #682 should be "0 (invalid)".

In response to the flag being "0", one of the queue sets #0 to #5 constituting the erased block queue 30, the queue set #0 for example, is selected and the contents stored in the each queue #0-0 to #0-3 constituting the selected queue set #0 are read out under the control of the microprocessor 6. As mentioned above, the contents of the each queue are the physical block addresses of the free blocks. In the exemplified case, assume that the contents of the queues #0-0 to #0-3 are "0000000001111B (15)", "1110000110011B (7219)", "0101111110000B (3056)", and "1000100000000B (4352)".

When the contents of the queues #0-0 to #0-3 are read out, they are stored in the virtual block indicating area #682 and corresponding flag is changed from "0" to "1". Then, internal addresses are generated under the control of the microprocessor 6.

As shown in FIG. 11, the lower 2 bits (C) of the host addresses #0 to #3, the contents read from the corresponding queues, and the 5 bits (B) composed of the upper 14th bit to the upper 18th bit of the host addresses #0 to #3 are combined in this order under the control of the microprocessor 6 similarly to the data read operation. In the exemplified case, because the lower 2 bits (C) of the host addresses #0 to #3 are "00B" to "11B", respectively, the contents read from the queues are "0000000001111B", "1110000110011B", "0101111110000B", and "1000100000000B", respectively, and the every 5 bits (B) composed of the upper 14th bit to the upper 18th bit of the host addresses #0 to #3 are "10001B", the values of the four internal addresses #0 to #3 become the values shown in FIG. 11.

This completes the address translation from the host addresses #0 to #3 to the internal addresses #0 to #3.

In response to the storage of the external write command in the task file registers (not shown) included in the host interface block 7, the registers (not shown) included in the flash sequencer block 12 are set under the control of the microprocessor 6. This operation is performed as follows:

First, the internal write command, which is a kind of internal command, is set in the predetermined registers (not shown) included in the flash sequencer block 12 under the control of the microprocessor 6. Further, the internal addresses #0 to #3 are set in other registers (not shown) included in the flash sequencer block 12 under the control of the microprocessor 6.

When the above setting for the registers included in the flash sequencer block 12 is completed, the sequential data write operations are started by the flash sequencer block 12.

Figure 12:
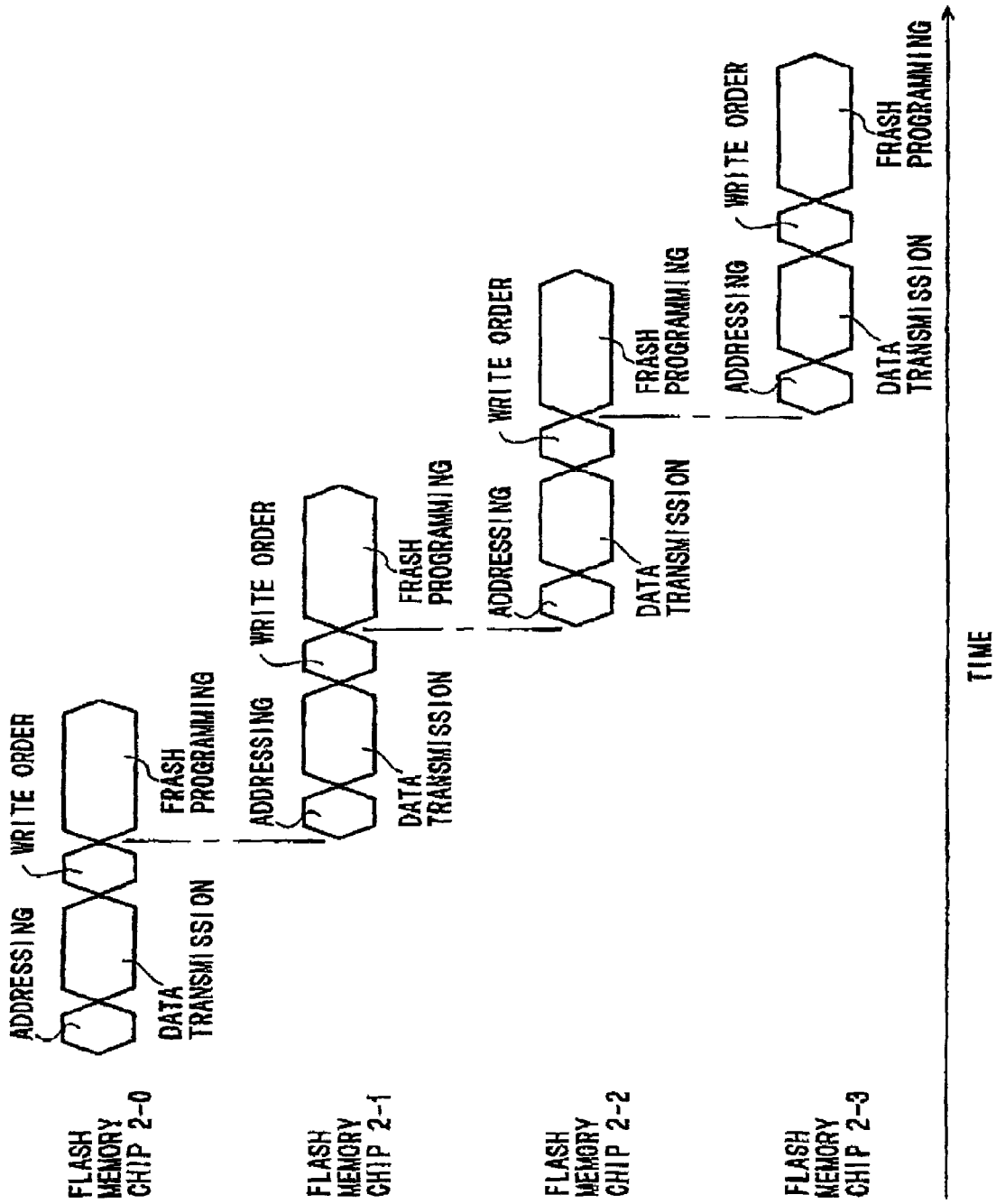
FIG. 12 is a timing chart showing the set of data write operations by a flash sequencer block 12.

FIG. 12 is a timing chart showing the set of data write operation by a flash sequencer block 12.

At first, the flash sequencer block 12 selects the internal address #0 whose upper 2 bits are "00B (0)" among the internal addresses stored in the registers (not shown) and directs the flash memory interface block 10 to activate the one of the chip selection signals #0 to #3 corresponding to the flash memory chip to be accessed among the flash memory chips 2-0 to 2-3 based on the upper 2 bits of the internal address #0. In the exemplified case, because the upper 2 bits of the internal address #0 are "00B (0)", the chip selection signal #0 is activated. Therefore, access of the flash memory chip 2-0 is enabled. The other chip selection signals #1 to #3 are kept in the inactive state.

Next, the flash sequencer block 12 directs the flash memory interface block 10 to send the lower 18 bits of the internal address #0, "000000000111110001B", and the internal write command stored in the prescribed registers (not shown) to the bus 15. Although the upper 18 bits of the internal address #0 and the internal write command are provided in common for the flash memory chips 2-0 to 2-3 via the bus 15, they are only valid for the flash memory chip 2-0 because the chip selection signal #0 is in the active state while the other the chip selection signals #1 to #3 are in the inactive state (addressing).

As a result, the flash memory chip 2-0 is enabled to write data into the physical page designated by the lower 18 bits of the internal address #0, "000000000111110001B".

Next, the data corresponding to the host address #0 among the write data stored in the buffer 9 and additional information including the error correction code to be written to redundant area 26 are supplied to the bus 15 via the flash memory interface block 10 under the control of the flash sequencer block 12. Although the write data and additional information including the error correction code are also supplied in common to the flash memory chips 2-0 to 2-3 via bus 15, they are only valid for the flash memory chip 2-0 because only the chip selection signal #0 is in the active state (data transmission).

After the write data and additional information including the error correction code are transferred to the flash memory chip 2-0 which is enabled to write data, the transferred data are temporarily stored in the internal register (not shown) employed in the flash memory chip 2-0.

Next, the flash sequencer block 12 issues the internal write command stored in the prescribed register to the flash memory chip 2-0 (write order).

In response to the write order, the flash memory chip 2-0 stores the data and additional information including the error correction code temporarily stored in the internal register to the address designated by the addressing operation (flash programming). Therefore, the data and additional information including the error correction code temporarily stored in the internal register are written in the page designated by the lower 18 bits of the internal address #0, "000000000111110001B", which is the physical page #17 of the physical block #15 included in the flash memory chip 2-0. The physical page #17 of the physical block #15 included in the flash memory chip 2-0 corresponds to the virtual page #68.

While the flash programming is performed by the flash memory chip 2-0, the flash sequencer block 12 selects the internal address #1 whose upper 2 bits are "01B (1)" among the internal addresses stored in the registers and activates the chip selection signal #1 based on the upper 2 bits of the internal address #1. Therefore, access of the flash memory chip 2-1 is enabled.

Next, the flash sequencer block 12 directs the flash memory interface block 10 to send the lower 18 bits of the internal address #1, "1110000110011100001B", and the internal write command stored in the prescribed registers (not shown) to the bus 15. In this case, they are only valid for the flash memory chip 2-1 because the chip selection signal #1 is in the active state (addressing).

Then, the data transmission and the write order are performed for the flash memory chip 2-1. Therefore, the data corresponding to the host address #1 and additional information including the error correction code are written in the page designated by the lower 18 bits of the internal address #1. In the exemplified case, because the lower 18 bits of the internal address #1 are "111000011001110001B", they are written in the physical page #17 of the physical block #7219 included in the flash memory chip 2-1. The physical page #17 of the physical block #7219 included in the flash memory chip 2-1 corresponds to the virtual page #69.

Such data write operations are also performed using the host addresses #2 and #3. Therefore, the data corresponding to the host addresses #2 and #3 and additional information including the error correction code are written in the page designated by the lower 18 bits of the internal addresses #2 and #3, respectively. In the exemplified case, because the lower 18 bits of the internal address #2 are "010111111000010001B", the data corresponding to the host address #2 and additional information including the error correction code are written in the physical page #17 of the physical block #3056 included in the flash memory chip 2-2. Similarly, because the lower 18 bits of the internal address #3 are "100010000000010001B", the data corresponding to the host address #3 and additional information including the error correction code are written in the physical page #17 of the physical block #4352 included in the flash memory chip 2-3.

The physical page #17 of the physical block #3056 included in the flash memory chip 2-2 corresponds to the virtual page #70, and the physical page #17 of the physical block #4352 included in the flash memory chip 2-3 corresponds to the virtual page #71.

The set of data write operations by the flash sequencer block 12 is thus completed.

In the sequential write operation, it is important for the user data corresponding to the successive host addresses #0 to #3 to be written in mutually different physical blocks included in the flash memory chips 2-0 to 2-3. As mentioned above, these four physical blocks constitute one virtual block #682. Therefore, the user data which correspond to the successive host addresses #0 to #3 are written in the successive virtual pages #68 to #71 of the same virtual block #682.

In response to the fact that the physical block addresses stored in the queue set #0 of the write queue 30 have been changed from the physical block addresses of the free blocks to the physical block addresses of the used blocks, the microprocessor 6 selects other physical blocks among the redundant blocks and stores their physical block addresses in the queues #0-0 to #0-3.

This completes the set of data write operation.

Next, the data overwrite operation of the flash memory system 1 will be explained using an example.

In the data overwrite operation of the flash memory system 1, the data stored in the physical block including the physical page to be overwritten must be transferred to another block. The reason this is necessary is as follows:

As explained earlier, each flash memory cell 16 included in the flash memory chips 2-0 to 2-3 can be changed from the erased state to the programmed state as an individual unit but cannot be changed from the programmed state to the erased state as an individual unit. In order to change the programmed state to the erased state, it is required to perform a block erasing operation to change the states of all flash memory cells 16 included in the block to the erased state. For this reason, in order to write user data to a certain physical page, all flash memory cells 16 constituting the user area 25 of the physical page must be in the erased state. In other words, the different user data cannot be directly overwritten in the physical page in which the certain user data are already stored, i.e., if at least one of the flash memory cells 16 constituting the user area 25 of the physical page is in the programmed state. Therefore, in order to write new data in the physical page in which the certain user data are already stored, first, the physical block including this physical page must be block-erased to change the states of all flash memory cells 16 included therein to the erased state, whereafter the new data can be written in this physical page.

Therefore, in the case where the old data stored in the certain physical page are overwritten by the new data, the user data stored in the other physical pages must be transferred to the physical pages of another physical block so as to prevent the data from being lost.

In this specification, such an operation performed during data overwriting is called an "inter-block data transfer". The physical block address of the source physical block is called a "source block address" and the physical block address of the destination physical block is called a "destination block address".

The data overwrite operation will be explained for the case where the external write command, the successive host addresses to which some data are already assigned, "110000001001100111000B" to "110000001001100111011B" for example, and user data to be written are supplied to the flash memory system 1 via the bus 14, the connector 4, and the bus 13 from the host computer 5.

First, when the host addresses #0 to #3 and the external write command are supplied to the controller 3, the host addresses #0 to #3 and the external write command are temporarily stored in the task file register (not shown) of the host interface block 7. Further, when the user data to be written are supplied to the controller 3, they are transferred to the ECC block 11 under the control of the microprocessor 6. In response to receipt of the user data, the ECC block 11 analyzes the user data to generate the error correction code and the ECC block 11 temporarily stores it. On the other hand, the user data are stored in the buffer 9.

When the host addresses are found to be valid, the generation of the source block address and the destination block address is performed using the address translation table 27.

Figure 13:
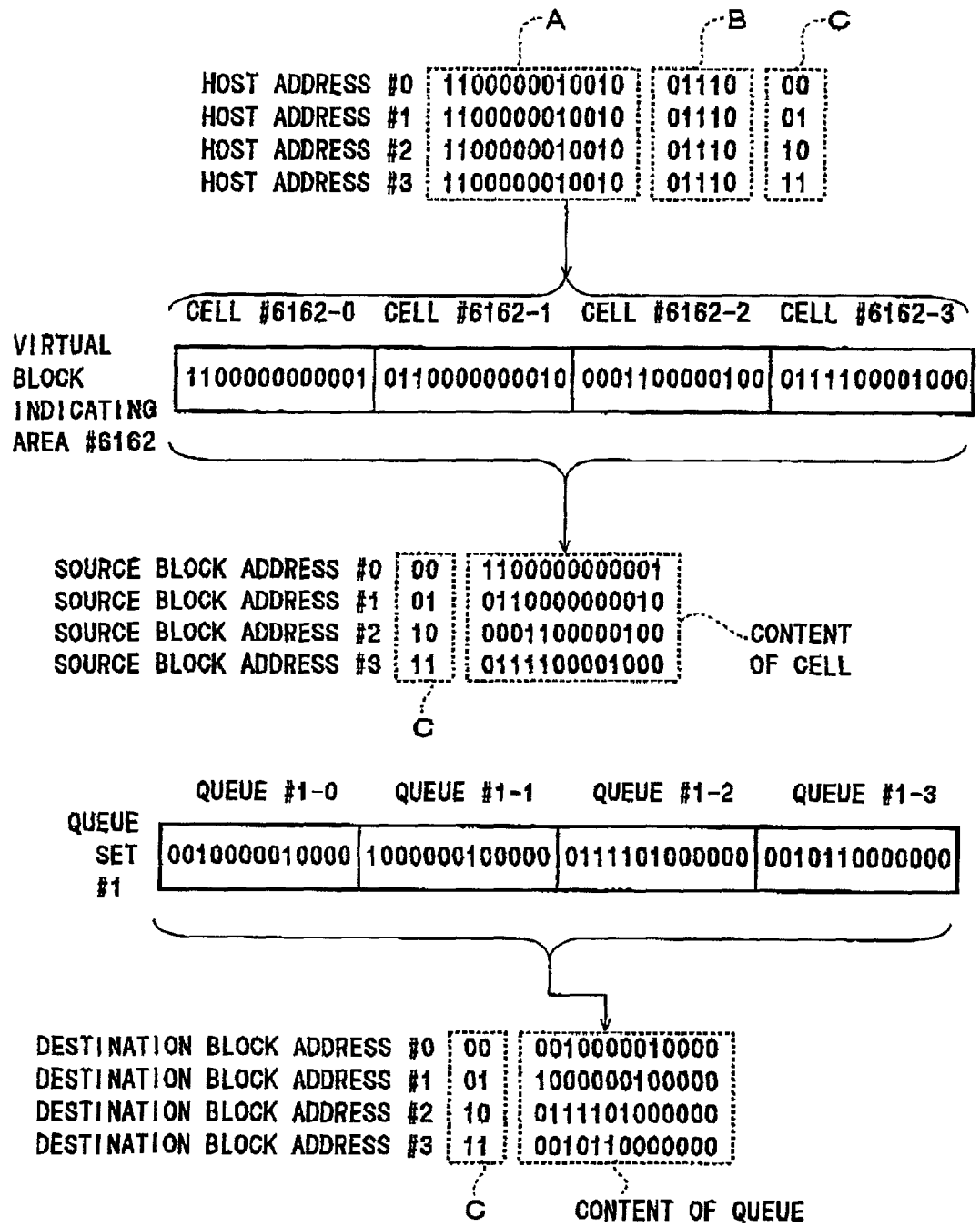
FIG. 13 is a schematic diagram explaining methods for generating a source block address and a destination block address.

FIG. 13 is a schematic diagram explaining the methods for generating a source block address and a destination block address.

As shown in FIG. 13, in the exemplified case, because the upper 13 bits (A) of the host addresses #0 to #3 are "1100000010010B", the virtual block indicating area #6162 is selected.

Therefore, the virtual block indicating area #6162 of the address translation table 27 stored in the SRAM work area 8 is selected and contents stored therein are read out under the control of the microprocessor 6. Because this data write operation is a data overwrite operation that is an operation for assigning new data to the host address in which some data are already assigned, the flag included in the virtual block indicating area #6162 is "1 (valid)". This means that the contents stored in the four cells #6162-0 to #6162-3 constituting the virtual block indicating area #6162 are valid. In the exemplified case, assume that the contents of the cells #6162-0 to #6162-3 are "1100000000001B", "0110000000010B", "0001100000100B", and "0111100001000B".

When the contents of the cells #6162-0 to #6162-3 are read out, the source block addresses are generated under the control of the microprocessor 6.

The source block addresses are generated such that the lower 2 bits (C) of the host addresses #0 to #3 and the contents read from the corresponding cells are combined in this order under the control of the microprocessor 6. In the exemplified case, the lower 2 bits (C) of the host addresses #0 to #3 are "00B" to "11B", respectively, and the contents read from the cells are "1100000000001B", "0110000000010B", "0001100000100B", and "0111100001000B", respectively, so that the values of the four source block addresses #0 to #3 become the values shown in FIG. 13.

This completes the generation of the source block addresses #0 to #3.

Next, one of the queue sets #0 to #5 constituting the write queue 30, the queue set #1 for example, is selected and the contents stored in the each queue #1-0 to #1-3 constituting the selected queue set #1 are read out under the control of the microprocessor 6. As mentioned above, the contents of the each queue are the physical block addresses of the free blocks. As shown in FIG. 13, assume that the contents of the queues #1-0 to #1-3 are "0010000010000B", "1000000100000B", "0111101000000B", and "0010110000000B".

When the contents of the queues #1-0 to #1-3 are read out, they are overwritten in the cells #6162-0 to #6162-3 included in the virtual block indicating area #6162, and the destination block addresses are generated under the control of the microprocessor 6.

The destination block addresses are generated such that the lower 2 bits (C) of the host addresses #0 to #3 and the contents read from the corresponding queues are combined in this order under the control of the microprocessor 6. In the exemplified case, the lower 2 bits (C) of the host addresses #0 to #3 are "00B" to "11B", respectively, and the contents read from the queues are "0010000010000B", "1000000100000B", "0111101000000B", and "0010110000000B", respectively, so that the values of the four destination block addresses #0 to #3 become the values shown in FIG. 13.

This completes the generation of the destination block addresses #0 to #3.

In response to storage of the external write command in the task file registers (not shown) included in the host interface block 7, the registers (not shown) included in the flash sequencer block 12 are set under the control of the microprocessor 6. This operation is performed as follows:

First, the internal write command and the internal read command are set in the predetermined registers (not shown) included in the flash sequencer block 12 under the control of the microprocessor 6. Further, the source block addresses #0 to #3 and the destination block addresses #0 to #3 are set in other registers (not shown) included in the flash sequencer block 12 under the control of the microprocessor 6.

When the above setting for the registers included in the flash sequencer block 12 is completed, the sequential data transferring operations are started by the flash sequencer block 12. Details of the sequential data transferring operations will be explained:

First, the flash sequencer block 12 generates the internal source address of 20 bits by adding "00000B (0)" to the source block address #0 stored in the prescribed register. In this case the internal source address becomes "00110000000000100000B". Next, the flash sequencer block 12 directs the flash memory interface block 10 to activate the one of the chip selection signals #0 to #3 corresponding to the flash memory chip to be accessed among the flash memory chips 2-0 to 2-3 based on the upper 2 bits of the generated internal source address. In the exemplified case, because the upper 2 bits of the internal source address are "00B (0)", the chip selection signal #0 is activated. Therefore, access of the flash memory chip 2-0 is enabled. The other chip selection signals #1 to #3 are kept in the inactive state.

Next, the flash sequencer block 12 directs the flash memory interface block 10 to send the lower 18 bits of the internal source address, "110000000000100000B", and the internal read command stored in the prescribed registers (not shown) to the bus 15.

As a result, the flash memory chip 2-0 can read data stored at the lower 18 bits of the internal source address "110000000000100000B". That is, the flash memory chip 2-0 reads data stored at the physical page #0 of the physical block #6145.

As explained earlier, in this embodiment, because the virtually combined four physical blocks constitute one virtual block, the physical page #0 of the physical block #6145 included in the flash memory chip 2-0 corresponds to the virtual page #0 in the virtual block.

The user data and additional information read from the flash memory chip 2-0 are supplied to the flash memory interface block 10 via the bus 15. When the flash memory interface block 10 receives the user data, the user data are temporarily stored in the buffer 9 and they are supplied to the ECC block 11 to generate a new error correction code. The new error correction code is temporarily stored in the ECC block 11.

Such a data read operation is also performed by adding "00000B (0)" to the source block addresses #1 to #3 so as to read data from the flash memory chips 2-1 to 2-3. As a result, data stored in the physical page #0 of the physical block #3074 included in the flash memory chip 2-1, the physical page #0 of the physical block #772 included in the flash memory chip 2-2, and the physical page #0 of the physical block #3848 included in the flash memory chip 2-3 are also read out. The physical page #0 of the physical block #3074 included in the flash memory chip 2-1 corresponds to the virtual page #1; the physical page #0 of the physical block #772 included in the flash memory chip 2-2 corresponds to the virtual page #2; and the physical page #0 of the physical block #3848 included in the flash memory chip 2-2 corresponds to the virtual page #3. That is, this completes the data reading from the virtual pages #0 to #3 of the virtual block #6162.

Next, the data write operations for storing the user data stored in the buffer 9 and the error correction codes stored in the ECC block 11 are performed.

First, the flash sequencer block 12 generates the internal destination address of 20 bits by adding "00000B (0)" to the destination block address #0 stored in the prescribed register. In this case the internal destination address becomes "00001000001000000000B".

Next, the flash sequencer block 12 directs the flash memory interface block 10 to activate the one of the chip selection signals #0 to #3 corresponding to the flash memory chip to be accessed among the flash memory chips 2-0 to 2-3 based on the upper 2 bits of the generated internal destination address. In the exemplified case, because the upper 2 bits of the internal destination address are "00B (0)", the chip selection signal #0 is activated. Therefore, access of the flash memory chip 2-0 is enabled.

Next, the flash sequencer block 12 directs the flash memory interface block 10 to send the lower 18 bits of the internal destination address and the internal write command stored in the prescribed registers (not shown) to the bus 15. Although the lower 18 bits of the internal destination address and the internal write command are provided in common for the flash memory chips 2-0 to 2-3 via the bus 15, they are only valid for the flash memory chip 2-0 because the chip selection signal #0 is in the active state while the other the chip selection signals #1 to #3 are in the inactive state (addressing).

Next, the user data read from the flash memory chip 2-0 among the user data stored in the buffer 9 and the additional information to be stored in the redundant area 26 including the corresponding error correction code stored in the ECC block 11 and the virtual block address, #682, are supplied to the bus 15 via the flash memory interface block 10 under the control of the flash sequencer block 12. Although the user data and the additional information are also supplied in common to the flash memory chips 2-0 to 2-3 via bus 15, they are only valid for the flash memory chip 2-0 because only the chip selection signal #0 is in the active state (data transmission). The transferred user data and the additional information are temporarily stored in the internal register (not shown) employed in the flash memory chip 2-0.

Next, the flash sequencer block 12 issues the internal write command stored in the prescribed register to the flash memory chip 2-0 (write order).

In response to the write order, the flash memory chip 2-0 stores the user data and the additional information temporarily stored in the internal register to the address designated by the addressing operation (flash programming). Therefore, the data temporarily stored in the register are written in the page designated by the lower 18 bits of the internal destination address, "001000001000000000B", which is the physical page #0 of the physical block #1040 included in the flash memory chip 2-0. The physical page #0 of the physical block #1040 included in the flash memory chip 2-0 corresponds to the virtual page #0.

While the flash programming is performed by the flash memory chip 2-0, the flash sequencer block 12 generates a new internal destination address by adding "00000B (0)" to the destination block address #1 stored in the prescribed register. In this case the new internal destination address becomes "011000000100000000000B". Next, the flash sequencer block 12 directs the flash memory interface block 10 to activate the chip selection signal #1 based on the upper 2 bits of the new internal destination address. Therefore, access of the flash memory chip 2-1 is enabled.

Next, the flash sequencer block 12 directs the flash memory interface block 10 to send the lower 18 bits of the internal destination address and the internal write command stored in the prescribed registers (not shown) to the bus 15. They are only valid for the flash memory chip 2-1 because the chip selection signal #1 is in the active state while the other the chip selection signals #0, #2, and #3 are in the inactive state (addressing).

Next, the user data read from the flash memory chip 2-1 among the user data stored in the buffer 9 and the additional information to be stored in the redundant area 26 including the corresponding error correction code stored in the ECC block 11 and the virtual block address, #682, are supplied to the bus 15 via the flash memory interface block 10 under the control of the flash sequencer block 12 (data transmission). Then, the flash sequencer block 12 issues the internal write command to the flash memory chip 2-1 (write order). In response to the write order, the flash memory chip 2-1 performs flash programming so as to store the user data and the additional information temporarily stored in the register to the page designated by the lower 18 bits of the internal destination address, "100000010000000000B", which is the physical page #0 of the physical block #4128 included in the flash memory chip 2-1. The physical page #0 of the physical block #4128 included in the flash memory chip 2-1 corresponds to the virtual page #1.

Such data write operations are also performed by adding "00000B (0)" to the destination block addresses #2 and #3 so as to write data to the flash memory chips 2-2 and 2-3. As a result, the user data read from the flash memory chip 2-2 and the additional information are written in the physical page #0 of the physical block #3904 included in the flash memory chip 2-2; and user data read from the flash memory chip 2-3 and the additional information are written in the physical page #0 of the physical block #1408 included in the flash memory chip 2-3. The physical page #0 of the physical block #3904 included in the flash memory chip 2-2 corresponds to the virtual page #2; and the physical page #0 of the physical block #1408 included in the flash memory chip 2-2 corresponds to the virtual page #3.

Then, the data stored in the virtual pages #0 to #3 of the source virtual block are written in the virtual pages #0 to #3 of the destination virtual block, respectively. This completes the data transferring from the virtual pages #0 to #3 of the source virtual block to the virtual pages #0 to #3 of the destination virtual block.

Such data transferring operations are successively performed by incrementing the 5 bits to be added to the source block addresses and the destination block addresses. Specifically, when the 5 bits to be added to the source block addresses and the destination block addresses are "00001B (1)", the data transferring operations are performed from the virtual pages #4 to #7 of the source virtual block to the virtual pages #4 to #7 of the destination virtual block; and when the 5 bits to be added to the source block addresses and the destination block addresses are "00010B (2)", the data transferring operations are performed from the virtual pages #8 to #11 of the source virtual block to the virtual pages #8 to #11 of the destination virtual block.

The data transferring operations are successively performed until the 5 bits to be added are coincident with the 5 bits (B) composed of the upper 14th bit to the upper 18th bit of the host addresses #0 to #3, "01110B (14)". Specifically, when the incrementation has made the 5 bits to be added "01110B (14)", i.e., coincident with the 5 bits (B) composed of the upper 14th bit to the upper 18th bit of the host addresses #0 to #3, the data transferring operations are temporarily suspended. In the exemplified case, the 5 bits to be added are coincident with the 5 bits (B) composed of the upper 14th bit to the upper 18th bit of the host addresses #0 to #3 at the time when the data transferring operations from the virtual pages #0 to #55 of the source virtual block to the virtual pages #0 to #55 of the destination virtual block are completed.

When the 5 bits to be added are coincident with the 5 bits (B) composed of the upper 14th bit to the upper 18th bit of the host addresses #0 to #3, the flash sequencer block 12 generates new internal destination addresses by adding "01110B (14)" to the destination block addresses #0 to #3 without generating the internal source addresses corresponding to the 5 bits "01110B (14)" to be added. For example, the value of the internal destination address generated by adding "01110B (14)" to the destination block address #0 is "000010000010000001110B".

Next, the flash sequencer block 12 directs the flash memory interface block 10 to activate the chip selection signal #0 based on the upper 2 bits of the internal destination address and to send the lower 18 bits of the internal destination address and the internal write command stored in the prescribed registers (not shown) to the bus 15 (addressing).

Next, the user data corresponding to the host address #0 and the additional information to be stored in the redundant area 26 including the corresponding error correction code are supplied to the bus 15 via the flash memory interface block 10 under the control of the flash sequencer block 12. The transferred user data and the additional information are temporarily stored in the internal register (not shown) employed in the flash memory chip 2-0 (data transmission).

Then, the flash sequencer block 12 issues the internal write command stored in the prescribed register to the flash memory chip 2-0 (write order).

While the flash programming is being performed by the flash memory chip 2-0, the flash sequencer block 12 generates a new internal destination address by adding "01110B (14)" to the destination block address #1 and performs the addressing, data transmission and write order so as to write the user data and the additional information to the flash memory chip 2-1. Such parallel operations are already explained that the addressing, data transmission and write order are performed for one of the flash memory chips while another flash memory chip is performing the flash programming. Therefore, the user data corresponding to the host address #0 are written in the physical page #14 of the physical block #1040 included in the flash memory chip 2-0; the user data corresponding to the host address #1 are written in the physical page #14 of the physical block #4128 included in the flash memory chip 2-1; the user data corresponding to the host address #2 are written in the physical page #14 of the physical block #3904 included in the flash memory chip 2-2; and the user data corresponding to the host address #3 are written in the physical page #14 of the physical block #1408 included in the flash memory chip 2-3.

That is, the user data corresponding to the host addresses #0 to #3 are stored in the virtual pages #56 to #59, respectively, of the destination virtual block.

When the data write operations for the host addresses #0 to #3 are completed, the data transferring operations using the internal source addresses and the internal destination addresses are restarted by incrementing the 5 bits to be added to the source block addresses #0 to #3 and the destination block addresses #0 to #3. The data transferring operations are successively performed until the data transferring operations using the internal source addresses and the internal destination addresses generated by adding "11111B (31)" are completed. Specifically, the data transferring operations are successively performed until the data transferring operations from the virtual pages #60 to #127 of the source virtual block to the virtual pages #60 to #127 of the destination virtual block are completed. This completes the sequential data transferring operations by the flash sequencer block 12.

Further, all physical blocks constituting the source virtual block are block-erased so as to become the free blocks.

This completes the inter-block data transfer.

According to the flash memory system 1 of this embodiment, because a plurality of physical blocks which belong to different flash memory chips from one another are treated as a single block, i.e., a virtual block, in the case where the data write request for writing data to successive addresses is issued from the host computer 5, the addressing, data transmission and so forth can be performed concerning the next data to be written during the flash programming, i.e., parallel operations can be performed. Therefore, a series of data write operations can be performed at high speed. Specifically, among the series of data write operations, the flash programming period is particularly long, typically about 200 μsec. According to the flash memory system 1 of this embodiment, however, the time period required to complete the series of data write operations is shortened because the other operations can be performed in parallel during the flash programming.

Next, a flash memory system that is another preferred embodiment of the present invention will be explained.

Figure 14:
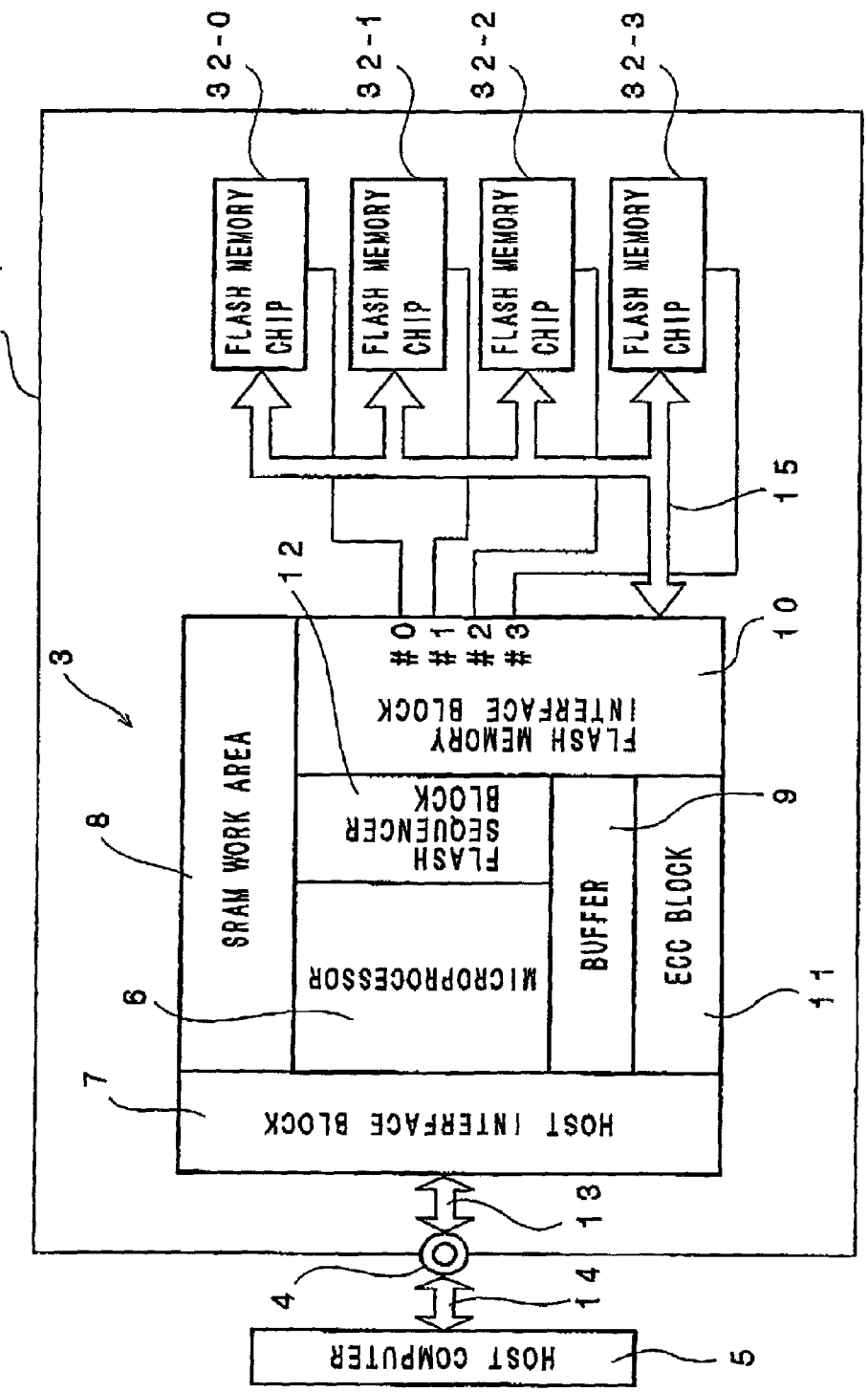
FIG. 14 is a schematic block diagram showing a flash memory system 31 that is another preferred embodiment of the present invention.

FIG. 14 is a schematic block diagram showing a flash memory system 31 that is another preferred embodiment of the present invention.

As shown in FIG. 14, the flash memory system 31 of this embodiment has the same configuration of the flash memory system 1 of above-described embodiment except for the type of the flash memory chips employed therein.

The address space of the flash memory chips 32-0 to 32-3 is the same as that of the flash memory chips 2-0 to 2-3 employed in the flash memory system 1 of the above-described embodiment shown in FIG. 4.

Each of the flash memory chips 32-0 to 32-3 is a "bank type" chip. The physical blocks included in the flash memory chips 32-0 to 32-3 are divided into a plurality of banks each having an independent register. Both simultaneous data writing and simultaneous block erasing can be performed with respect to a plurality of physical blocks belonging to different banks from one another.

Figure 15:
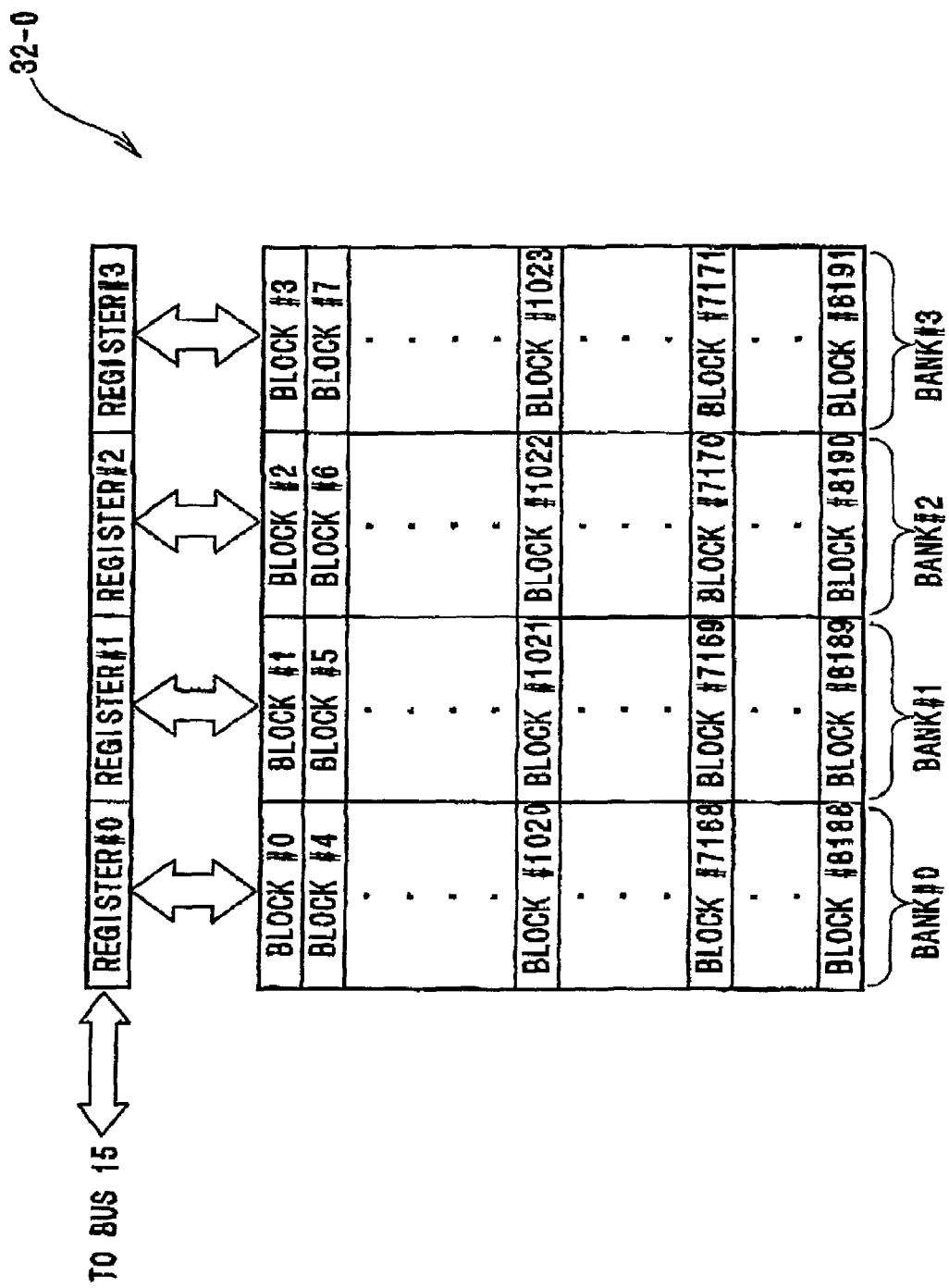
FIG. 15 is a schematic diagram showing the structure of a flash memory chip 32-0.

FIG. 15 is a schematic diagram showing the structure of the flash memory chip 32-0.

As shown in FIG. 15, the physical blocks #0 to #8191 constituting the flash memory chip 32-0 are divided into four banks #0 to #3. Specifically, the physical blocks #4m (m representing an integer number between 0 to 2047) belong to the bank #0, the physical blocks #4m+1 belong to the bank #1, the physical blocks #4m+2 belong to the bank #2, and the physical blocks #4m+3 belong to the bank #3.

Further, the flash memory chip 32-0 employs four registers #0 to #3 associated with the banks #0 to #3. Each register #0 to #3 can temporarily store data of one page size. For example, in case of reading data from a certain physical block belonging to the bank #0, the read data are temporarily stored in the register #0 and then transferred to the controller 3 via the bus 15. In case of writing data to a certain physical block belonging to the bank #0, the data transferred from the controller 3 via the bus 15 are temporarily stored in the register #0 and then stored in the certain physical block. In the case of the operations for reading or writing data from/to certain physical blocks belonging to the banks #1 to #3, the associated registers #1 to #3 are similarly used.

The data transfer from physical blocks to associated registers (data reading) and the data transfer from registers to associated physical blocks (data writing) can be performed independently in the respective banks. Differently from the flash memory chip 2-0, therefore, the flash memory chip 32-0 can perform parallel writing of 4 pages of data.

Although not shown in FIG. 15, each of the flash memory chips 32-1 to 32-3 is also divided into 4 banks #0 to #3 and employs registers #0 to #3 associated with the respective banks.

Among the 2048 physical blocks in each bank #0 to #3 of the flash memory chips 32-0 to 32-3, 2000 physical blocks are used as actual use blocks and the remaining 48 physical blocks are used as redundant blocks.

Further, four virtually combined actual use blocks each selected from a different bank #0 to #3 in the same flash memory chip 32-0 to 32-3 constitutes a "virtual block". Therefore, 2000 virtual blocks can be formed in each flash memory chip 32-0 to 32-3.

Figure 16:
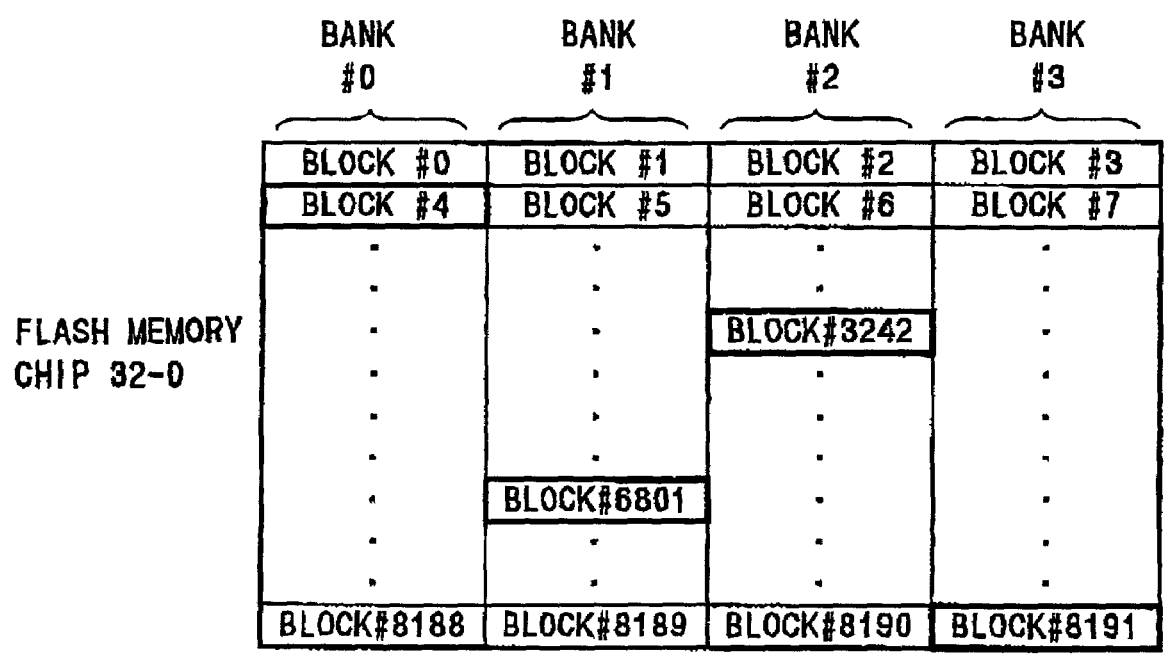
FIG. 16 is a schematic diagram showing an example of the virtual block in the flash memory chip 32-0.

FIG. 16 is a schematic diagram showing an example of a virtual block in the flash memory chip 32-0.

In the mapping example shown in FIG. 16, the physical block #4 in the bank #0, the physical block #6801 in the bank #1, the physical block #3242 in the bank #2, and the physical block #8191 in the bank #3 are virtually combined to form one virtual block. In this embodiment, four physical blocks constituting one virtual block are required to belong to different banks from one another in the same flash memory chip. Thus, a maximum of 2000 virtual blocks are constituted in each flash memory chip 32-0 to 32-3: the virtual blocks #0 to #1999 are formed in the flash memory chip 32-0, the virtual blocks #2000 to #3999 are formed in the flash memory chip 32-1, the virtual blocks #4000 to #5999 are formed in the flash memory chip 32-2, and the virtual blocks #6000 to #7999 are formed in the flash memory chip 32-3.

FIG. 17 is a schematic diagram showing the virtual page structure of the virtual block shown in FIG. 16.

As shown in FIG. 17, the virtual block is treated as single block constituted of 128 virtual pages consisting of the virtual pages #0 to #127. The 32 physical pages contained in the portion constituted by the physical block #4 are assigned virtual page numbers #4$i$ ($i$ representing a physical page number); the 32 physical pages contained in the portion constituted by the physical block #6801 are assigned virtual page numbers #4$i$+1; the 32 physical pages contained in the portion constituted by the physical block #3242 are assigned virtual page numbers #4$i$+2; and the 32 physical pages contained in the portion constituted by the physical block #8191 are assigned virtual page numbers #4$i$+3.

FIG. 18 is a schematic diagram showing the data structure of an address translation table 33 indicating the relationship between each of 8000 virtual blocks and the 4 physical blocks forming the virtual block.

As shown in FIG. 18, although the data structure of the address translation table 33 is almost the same as that of the address translation table 27, in the flash memory system 31, a part of the addresses of the physical blocks constituting each virtual block, specifically the upper 11 bits of the physical block addresses, are stored in the corresponding cells #j-0 to #j-3 of the address translation table 33. For example, assuming that the virtual block shown in FIGS. 16 and 17 is the virtual block #0, "00000000001B (1)", "11010100100B (1700)", "01100101010B (810)", and "11111111111B (2047)" are stored in the cells #0-0 to #0-3, respectively, because the virtual block #0 is constituted of the physical block #4 whose physical block address is "0000000000100B", the physical block #6081 whose physical cal block address is "11010100010001B", the physical block #3242 whose physical block address is "01100101010B", and the physical block #8191 whose physical block address is "11111111111B".

The flag included in each virtual block indicating area indicates whether the content of the corresponding cell is valid or invalid. Specifically, when the flag indicates "1", the content of the corresponding cell is valid; and when the flag indicates "0", the content of the corresponding cell is invalid. Therefore, the content of the cells #j-0 to #j-3 where the corresponding flag indicates "0" is invalid.

A slot #0 which is constituted of the cells #j-0 corresponds to the bank #0; a slot #1 which is constituted of the cells #j-1 corresponds to the bank #1; a slot #2 which is constituted of the cells #j-2 corresponds to the bank #2; and a slot #3 which is constituted of the cells #j-3 corresponds to the bank #3.

The address translation table 33 having the above-described structure is stored in the SRAM work area 8.

Figure 19:
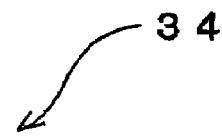
FIG. 19 is a schematic diagram showing the data structure of an erased block queue 34 stored in the SRAM work area 8.

FIG. 19 is a schematic diagram showing the data structure of an erased block queue 34 stored in the SRAM work area 8.

As shown in FIG. 19, the erased block queue 34 is constituted of four queue sets consisting of the queue sets #0 to #3 each of which is constituted of four queues consisting of the queues #k-0 to #k-3 (k representing a queue set number). The queues #k-0 correspond to the bank #0; the queues #k-1 correspond to the bank #1; the queues #k-2 correspond to the bank #2; and the queues #k-3 correspond to the bank #3. Further, the queue sets #0 to #3 correspond to the flash memory chips 32-0 to 32-3, respectively.

A part of the physical block addresses, upper 11 bits, of the physical blocks in which all flash memory cells 16 constituting the user area 25 are in the erased state (free blocks) are stored in the queues #k-0 to #k-3 of the queue sets #0 to #3. For example, in the case where the physical block #152 which belongs to the flash memory chip 32-0 is to be registered in the erased block queue 34, the upper 11 bits of the physical block address, "00000100110B", are stored in the queue #0-0 because the physical block is included in the bank #0.

The generation of the erased block queue 34 is performed under the control of the microprocessor 6 during the generation of the address translation table 33. The physical block addresses to be registered in the erased block queue 34 are selected from the redundant blocks awaiting the data write operation.

Although the operations of the flash memory system 31 having the above-described configuration is basically the same as those of the flash memory system 1, they are different in the method of translating from the host address to the internal addresses using the address translation table 33.

Figure 20:
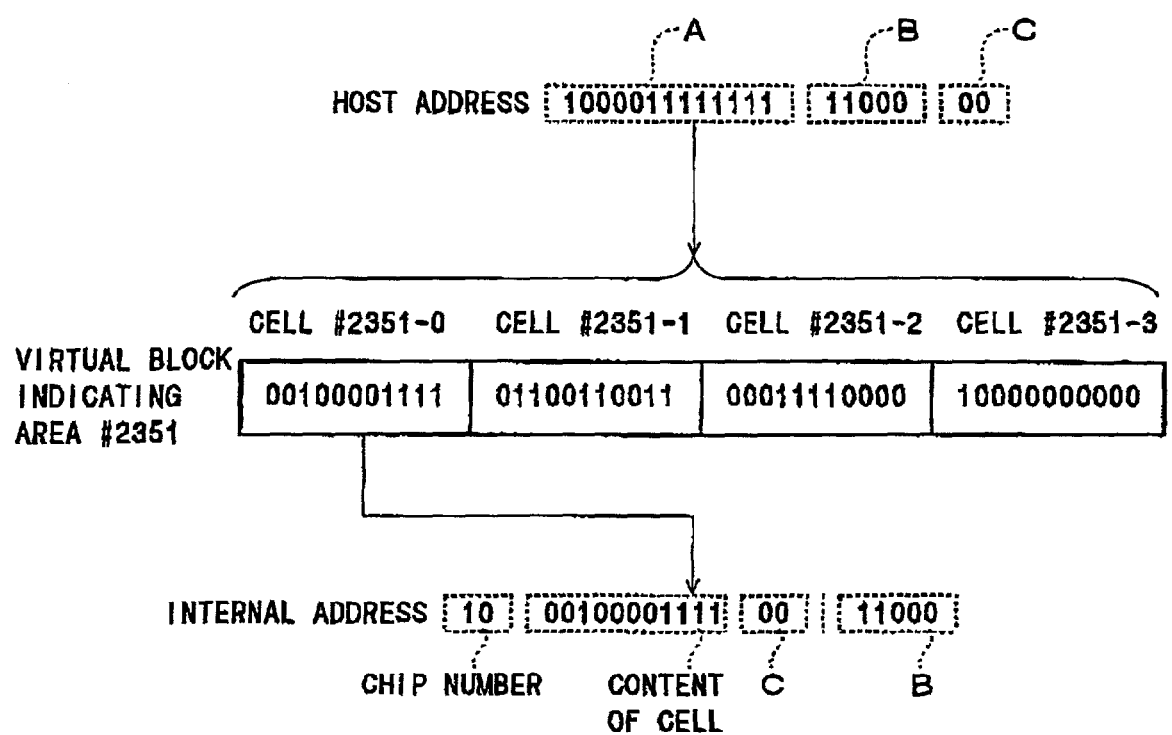
FIG. 20 is a schematic diagram showing the translation method to obtain an internal address using the address translation table 33 during the data read operation.

FIG. 20 is a schematic diagram showing the translation method for obtaining an internal address using the address translation table 33 during the data read operation.

Here, assume that the host computer 5 data reading from the host address "10000111111111100000B".

In FIG. 20, "A" indicates the upper 13 bits of the host address, "B" indicates 5 bits composed of the upper 14th bit to the upper 18th bit of the host address, and "C" indicates the lower 2 bits of the host address, expediently.

First, the upper 13 bits (A) are extracted from the host address of 20 bits and divided by "2000" under the control of the microprocessor 6. The flash memory chip to be accessed is determined from the quotient (0 to 3) and the virtual block indicating area is determined from the remainder (0 to 1999). In the exemplified case, because the upper 13 bits (A) of the host address are "1000011111111B", the quotient is "10B (2)" and the remainder is "00101111111B (351)". This means that the flash memory chip to be accessed is the flash memory chip 32-2 and the virtual block indicating area to be selected is virtual block indicating area #2351 (351+2000).

Next, the virtual block indicating area #2351 is selected from the address translation table 33 stored in the SRAM work area 8, and the content of the one cell whose branch number is coincident with the lower 2 bits (C) of the host address is read out under the control of the microprocessor 6. In the exemplified case, because the lower 2 bits (C) of the host address are "00B (0)", the cell whose content is read out is the cell #2351-0. As shown in FIG. 20, it is assumed that the content of the cell #2351-0 is "00100001111B".

Next, the selected chip number, the content read from the cell, the lower 2 bits (C) of the host address, and the 5 bits (B) composed of the upper 14th bit to the upper 18th bit of the host address are combined in this order. The combined address is the internal address. In the exemplified case, the selected chip number is "10B", the content read from the cell is "00100001111B", the lower 2 bits (C) of the host address are "00B", and the 5 bits (B) composed of the upper 14th bit to the upper 18th bit of the host address are "11000B", so that "1000100000111100111000B" is obtained as the internal address as shown in FIG. 20.

This completes the address translation from the host address to the internal address.

The data read operations after the address translation is completed are the same as in the flash memory system 1 of the above-described embodiment. In this case, the data stored in the physical page #24 of the physical block #1084 included in the flash memory chip 32-2 is read out. The physical page #24 of the physical block #1084 corresponds to the virtual page #96 of the virtual block #2351.

Figure 21:
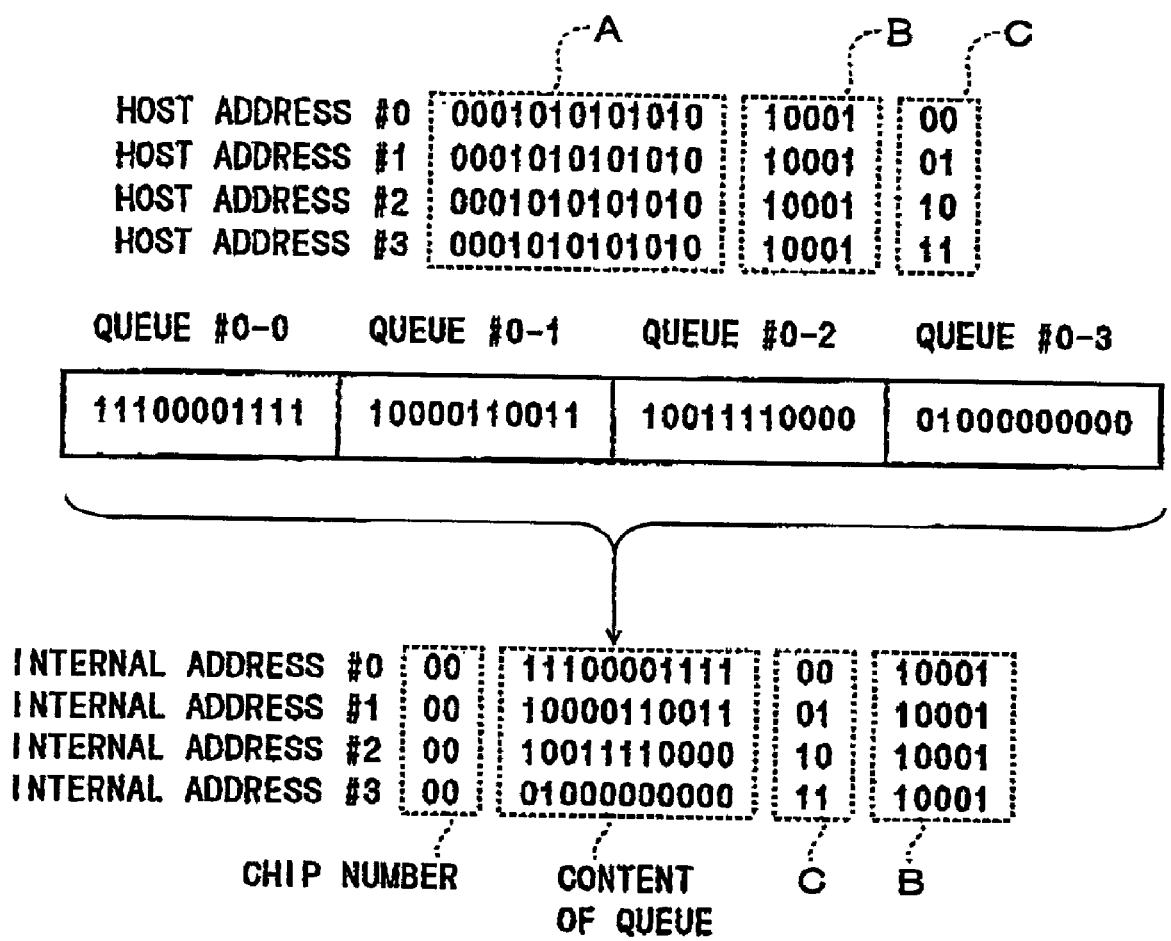
FIG. 21 is a schematic diagram showing a translation method for obtaining an internal address using the address translation table 33 during the data write operation.

FIG. 21 is a schematic diagram showing the translation method for obtaining an internal address using the address translation table 33 during the data write operation.

Here, assume that the host computer 5 request data writing using the successive host addresses #0 to #3, "00010101010101000100B" to "00010101010101000111B".

As shown in FIG. 21, because the upper 13 bits (A) of the host addresses #0 to #3 are "0001010101010B", the quotient and remainder obtained by dividing them by "2000" are "00B (0)" and "01010101010B (682)". This means that the flash memory chip to be accessed is the flash memory chip 32-0 and the virtual block indicating area to be selected is virtual block indicating area #682.

Next, among the queue sets #0 to #3 constituting the erased block queue 34, the queue set corresponding to the flash memory chip 32-0, queue set #0, is selected and the contents stored in the each queue #0-0 to #0-3 constituting the selected queue set #0 are read out under the control of the microprocessor 6. As mentioned above, the contents of each queue are the upper 11 bits of the physical block addresses of the free blocks. In the exemplified case, assume that the contents of the queues #0-0 to #0-3 are "11100001111B", "10000110011B", "10011110000B", and "01000000000B".

When the contents of the queues #0-0 to #0-3 are read out, they are stored in the virtual block indicating area #682 and the corresponding flag is changed from "0" to "1". Then, internal addresses are generated under the control of the microprocessor 6.

As shown in FIG. 21, the method for generating the internal address is the same as in the case of data read operation. That is, the selected chip number, the content read from the queues, the lower 2 bits (C) of the host addresses #0 to #3, and the 5 bits (B) composed of the upper 14th bit to the upper 18th bit of the host addresses #0 to #3 are combined in this order. In the exemplified case, the selected chip number is "00B", the contents read from the queues are "11100001111B", "10000110011B", "10011110000B", and "01000000000B", the lower 2 bits (C) of the host addresses #0 to #3 are "00B" to "11B", and the 5 bits (B) composed of the upper 14th bit to the upper 18th bit of the host addresses #0 to #3 are "10001B", so that the internal addresses #0 to #3 shown in FIG. 21 are obtained.

This completes the address translation from the host addresses #0 to #3 to the internal addresses #0 to #3.

Figure 22:
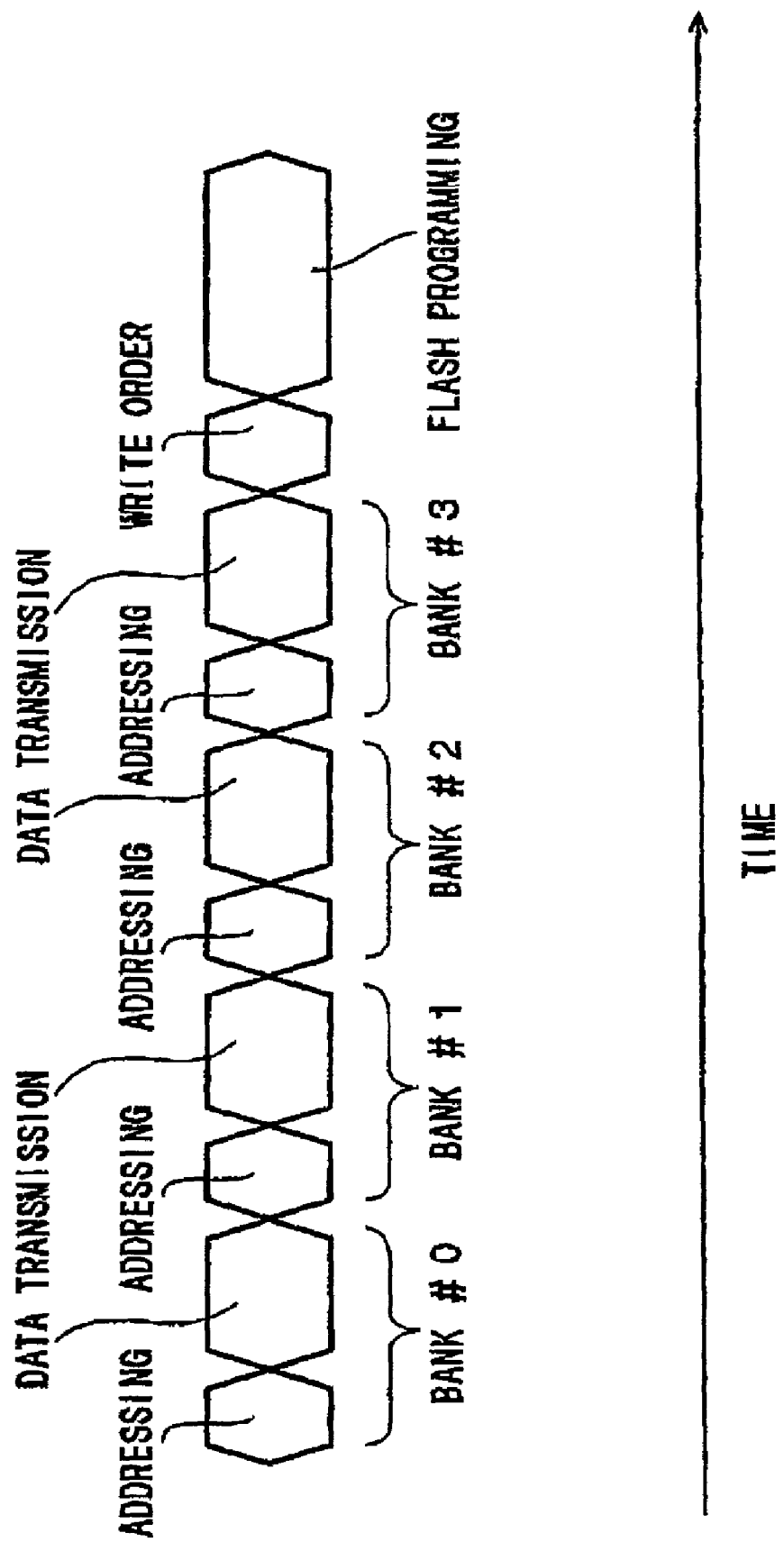
FIG. 22 is a timing chart showing the set of data write operations by a flash sequencer block 12.

FIG. 22 is a timing chart showing the set of data write operations by the flash sequencer block 12.

First, the flash sequencer block 12 activates the chip selection signal #0 based on the upper 2 bits of the internal address 00B(0) stored in the prescribed register.

Next, the flash sequencer block 12 directs the flash memory interface block 10 to send the lower 18 bits of the internal address #0, "111000011110010001B", and the data transferring command stored in the prescribed registers to the bus 15. The lower 18 bits of the internal address #0 and the internal write command are only valid for the flash memory chip 32-0 because the chip selection signal #0 is in the active state. Then, the register #0 employed in the flash memory chip 32-0 is activated based on the 2 bits composed of the upper 14th and 15th bits of the internal address #0 (addressing).

As a result, the flash memory chip 32-0 is enabled to write data into the physical page designated by the lower 18 bits of the internal address #0, "111000011110010001B".

Next, the data corresponding to the host address #0 among the write data stored in the buffer 9 and additional information including the error correction code to be written to redundant area 26 are supplied to the bus 15 via the flash memory interface block 10 under the control of the flash sequencer block 12. The write data and additional information including the error correction code are stored in the register #0 of the flash memory chip 32-0 because the register #0 is in the active state (data transmission).

The addressing and data transmission are also performed with respect to the data corresponding to the host addresses #1 to #3. Temporary storing of the write data and additional information including the error correction code corresponding to the host addresses #0 to #3 to the registers #0 to #3 of the flash memory chip 32-0 is thus completed.

Next, the flash sequencer block 12 issues the internal write command stored in a prescribed register (not shown) to the flash memory chip 32-0 (write order).

In response to the write order, the flash memory chip 32-0 stores the data and additional information including the error correction code temporarily stored in the registers #0 to #3 to the address designated by the addressing operation (flash programming). The set of data write operations by the flash sequencer block 12 is thus completed.

By the set of data write operations, the data corresponding to the host address #0 is stored in the physical page #17 of the physical block #7228 included in the flash memory chip 32-0, the data corresponding to the host address #1 is stored in the physical page #17 of the physical block #4301 included in the flash memory chip 32-0, the data corresponding to the host address #2 is stored in the physical page #17 of the physical block #5058 included in the flash memory chip 32-0, and the data corresponding to the host address #3 is stored in the physical page #17 of the physical block #2051 included in the flash memory chip 32-0. These physical pages #17 of the physical blocks #7228, #4301, #5058, and #2051 correspond to the virtual pages #68 to #71 of the virtual block #682.

As explained above, differently from in the flash memory system 1, in the flash memory system 31 of this embodiment, four physical blocks constituting the same virtual block are included in the same flash memory chip. However, in the case where the host computer 5 requests data writing to a plurality of successive addresses, since the four physical blocks constituting the same virtual block belong to different banks from one another, the write data corresponding to each host address can be successively transferred to the registers #0 to #3 and then be stored in the prescribed pages simultaneously. That is, in this embodiment, data extending over a plurality of pages can be flash programmed simultaneously.

Further, in the flash memory system 31 of this embodiment, because the bank type flash memory chip is used, such a parallel write operation can be performed even if the number of the flash memory chips is only one.

Next, a flash memory system that is still another preferred embodiment of the present invention will be explained.

As shown in FIG. 14, the flash memory system 35 of this embodiment has the same configuration of the flash memory system 31 of above-described embodiment. Therefore, each flash memory chip 32-0 to 32-3 employed in the flash memory system 35 is a bank type chip.

In this embodiment, four physical blocks selected from different banks #0 to #3 in the flash memory chip 32-0 and four physical blocks selected from different banks #0 to #3 in the flash memory chip 32-1 constitute "a virtual block". Similarly, four physical blocks selected from different banks #0 to #3 in the flash memory chip 32-2 and four physical blocks selected from different banks #0 to #3 in the flash memory chip 32-3 constitute "a virtual block". That is, each virtual block is constituted of eight virtually combined physical blocks. Therefore, the 4000 virtual blocks composed of virtual blocks #0 to #3999 can be formed. For convenience, the virtual blocks constituted of the physical blocks included in the flash memory chips 32-0 and 32-1 are called "zone #0" and the virtual blocks constituted of the physical blocks included in the flash memory chips 32-2 and 32-3 are called "zone #1".

Figure 23:
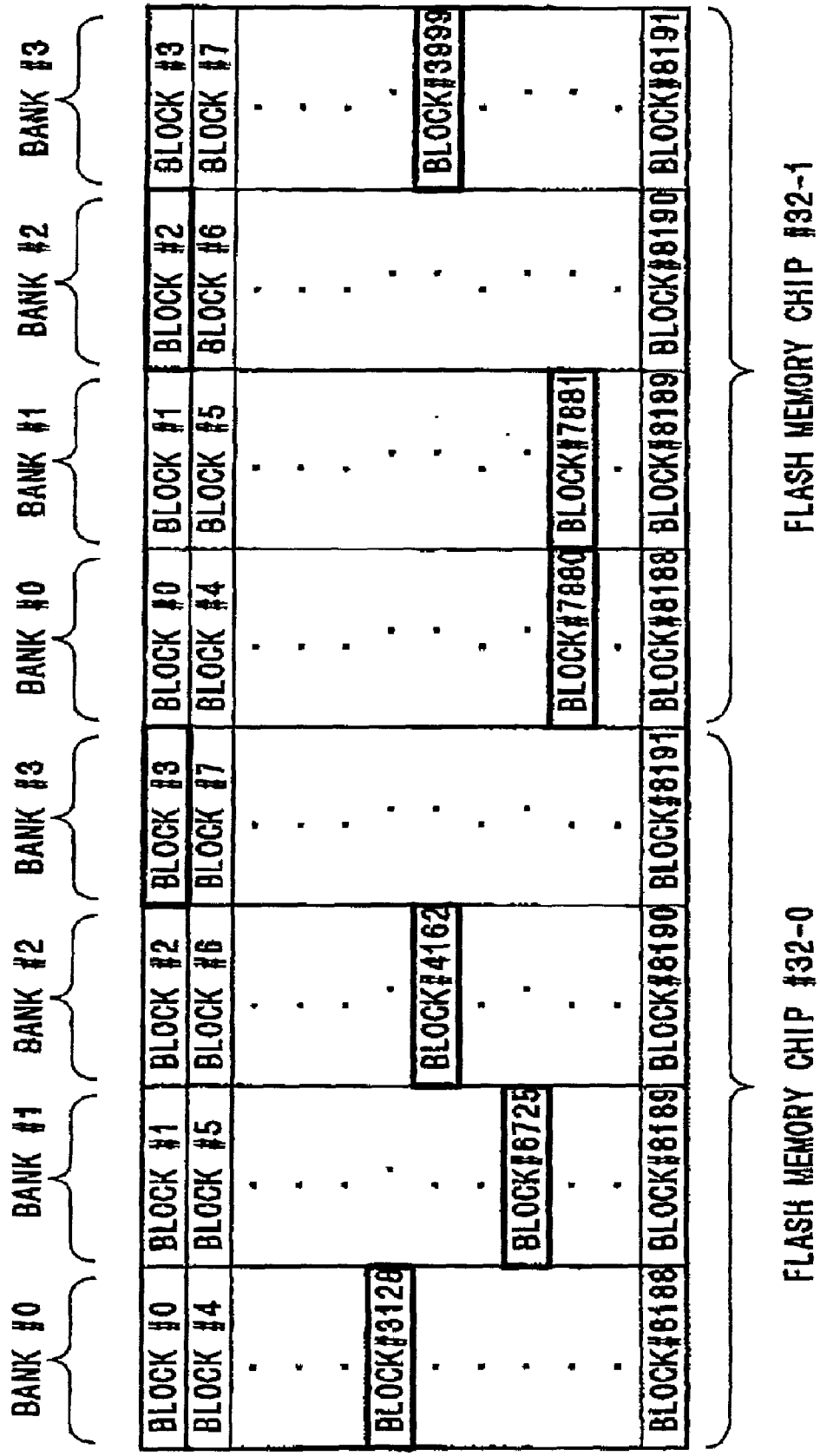
FIG. 23 is a schematic diagram showing a virtual block that is a further preferred embodiment of the present invention.

FIG. 23 is a schematic diagram showing an example of the virtual block of this embodiment.

In the mapping example shown in FIG. 23, the physical block #3128 in the bank #0 of the flash memory chip #32-0, the physical block #6725 in the bank #1 of the flash memory chip #32-0, the physical block #4162 in the bank #2 of the flash memory chip #32-0, the physical block #3 in the bank #3 of the flash memory chip #32-0, the physical block #7880 in the bank #0 of the flash memory chip #32-1, the physical block #7881 in the bank #1 of the flash memory chip #32-1, the physical block #2 in the bank #2 of the flash memory chip #32-1, and the physical block #3999 in the bank #3 of the flash memory chip #32-1 are virtually combined to form one virtual block. In this embodiment, among eight physical blocks constituting one virtual block, four physical blocks are required to belong to different banks from one another in one flash memory chip and the remaining four physical blocks are required to belong to different banks from one another in another flash memory chip.

Thus, a maximum of 4000 virtual blocks can be formed. The virtual blocks #0 to #1999 are formed in the flash memory chips 32-0 and 32-1, and the virtual blocks #2000 to #3999 are formed in the flash memory chips 32-2 and 32-3.

Figure 24:
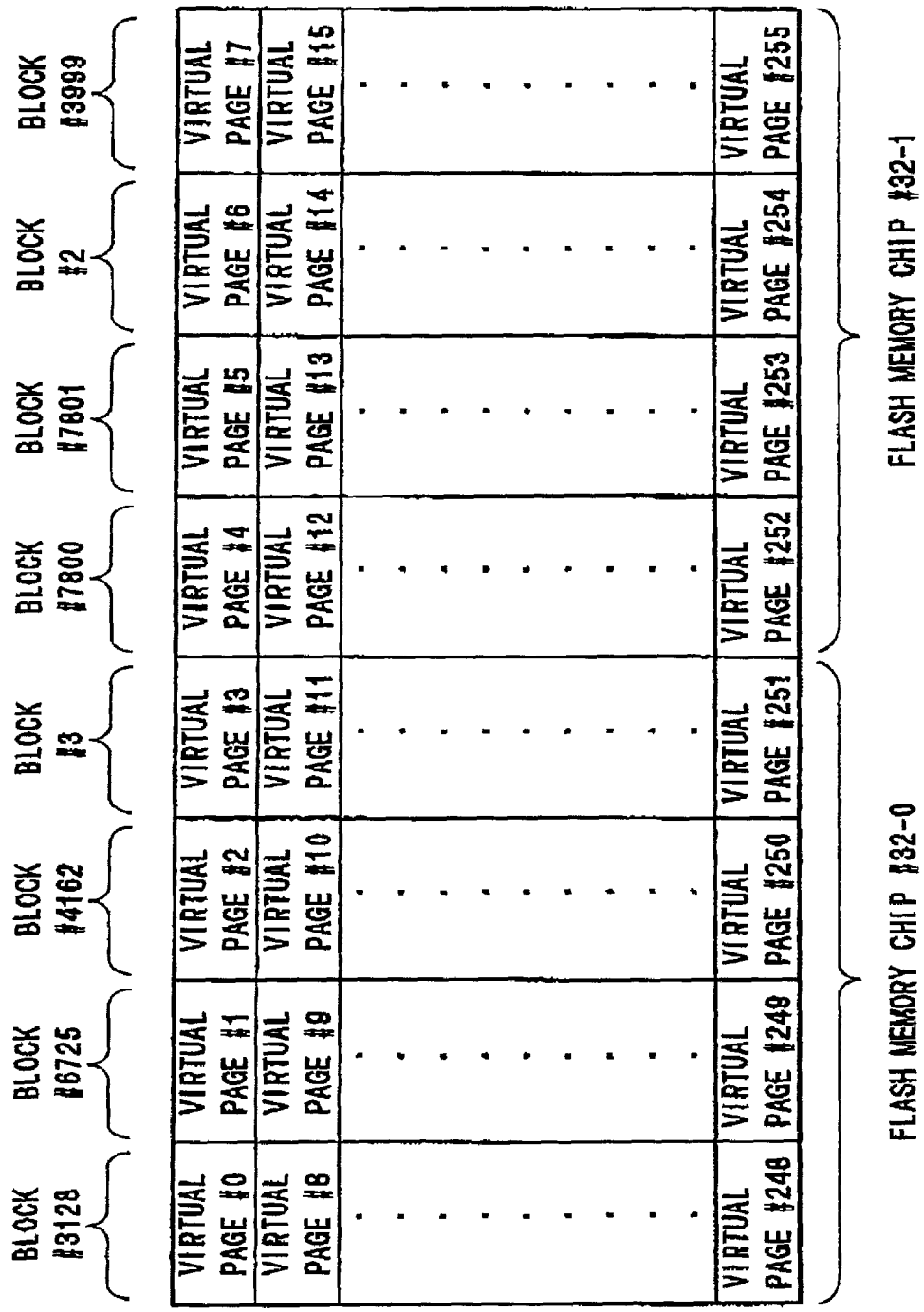
FIG. 24 is a schematic diagram showing the virtual page structure of the virtual block shown in FIG. 23.

FIG. 24 is a schematic diagram showing the virtual page structure of the virtual block shown in FIG. 23.

As shown in FIG. 24, the virtual block is treated as single block constituted of 256 virtual pages consisting of the virtual pages #0 to #255. Of the virtual blocks shown in FIG. 23, the 32 physical pages contained in the portion constituted by the physical block #3128 in the flash memory chip 32-0 are assigned virtual page numbers #8$i$ ($i$ representing a physical page number, $i$=0 to 31); the 32 physical pages contained in the portion constituted by the physical block #6725 in the flash memory chip 32-0 are assigned virtual page numbers #8$i$+1; the 32 physical pages contained in the portion constituted by the physical block #4162 in the flash memory chip 32-0 are assigned virtual page numbers #8$i$+2; the 32 physical pages contained in the portion constituted by the physical block #3 in the flash memory chip 32-0 are assigned virtual page numbers #8$i$+3, the 32 physical pages contained in the portion constituted by the physical block #7800 in the flash memory chip 32-1 are assigned virtual page numbers #8$i$+4; the 32 physical pages contained in the portion constituted by the physical block #7801 in the flash memory chip 32-1 are assigned virtual page numbers #8$i$+5; the 32 physical pages contained in the portion constituted by the physical block #2 in the flash memory chip 32-1 are assigned virtual page numbers #8$i$+6; and the 32 physical pages contained in the portion constituted by the physical block #3999 in the flash memory chip 32-1 are assigned virtual page numbers #8$i$+7.

FIG. 25 is a schematic diagram showing the data structure of an address translation table 36 indicating the relationship between each of 4000 virtual blocks and the 8 physical blocks forming the virtual block.

As shown in FIG. 25, the address translation table 36 has 4000 virtual block indicating areas consisting of virtual block indicating areas #0 to #3999 disposed in this order. Each virtual block indicating area is constituted of eight cells consisting of the cells #j-0 to #j-7 (j representing a virtual block address) and one flag. A slot #0 constituted of the cells #j-0 corresponds to the bank #0 of the flash memory chip 32-0 or 32-2; a slot #1 constituted of the cells #j-1 corresponds to the bank #1 of the flash memory chip 32-0 or 32-2; a slot #2 constituted of the cells #j-2 corresponds to the bank #2 of the flash memory chip 32-0 or 32-2; a slot #3 constituted of the cells #j-3 corresponds to the bank #3 of the flash memory chip 32-0 or 32-2; a slot #4 constituted of the cells #j-4 corresponds to the bank #0 of the flash memory chip 32-1 or 32-3; a slot #5 constituted of the cells #j-5 corresponds to the bank #1 of the flash memory chip 32-1 or 32-3; a slot #6 constituted of the cells #j 6 corresponds to the bank #2 of the flash memory chip 32-1 or 32-3; and a slot #7 constituted of the cells #j-7 corresponds to the bank #3 of the flash memory chip 32-1 or 32-3.

The upper 11 bits of the addresses of the physical blocks (physical block addresses) are stored in the corresponding cells #j-0 to #j-7. For example, assuming that the virtual block shown in FIGS. 23 and 24 is the virtual block #0, "01100001110B (782)", "11010010001B (1681)", "10000010000B (1040)", "00000000000B (0)", "11110011110B (1950)", "11110011110B (1950)", "00000000000B (0)", and "01111100111B (999)" are stored in the cells #0-0 to #0-7 as the physical block addresses, because the virtual block #0 is constituted of the physical blocks #3128, #6725, #4162, and #3 in the flash memory chip 32-0 and the physical blocks #7800, #7801, #2, and #3999 in the flash memory chip 32-1.

The flag included in each virtual block indicating area indicates whether the content of the corresponding cell is valid or invalid. Specifically, when the flag indicates "1", the content of the corresponding cell is valid; and when the flag indicates "0", the content of the corresponding cell is invalid. Therefore, the content of the cells #j-0 to #j-7 where the corresponding flag indicates "0" is invalid.

FIG. 26 is a schematic diagram showing the data structure of an erased block queue 37 stored in the SRAM work area 8.

As shown in FIG. 26, the erased block queue 37 is constituted of four queue sets consisting of the queue sets #0 to #3 each of which is constituted of eight queues consisting of the queues #k-0 to #k-7 (k representing a queue set number). The queues #k-0 to #k-3 correspond to the banks #0 to #3 of the flash memory chip 32-0 or 32-2; and the queues #k-4 to #k-7 correspond to the banks #0 to #3 of the flash memory chip 32-1 or 32-3. Further, the queue sets #0 and #1 correspond to the zone #0; and the queue sets #2 and #3 correspond to the zone #1.

A part of the physical block addresses, the upper 11 bits, of the physical block in which all flash memory cells 16 constituting the user area 25 are in the erased state (free blocks) are stored in the queues #k-0 to #k-7 of the queue sets #0 to #3.

The generation of the erased block queue 37 is performed under the control of the microprocessor 6 during the generation of the address translation table 36. The physical block addresses to be registered in the erased block queue 37 are selected from the redundant blocks awaiting the data write operation.

Figure 27:
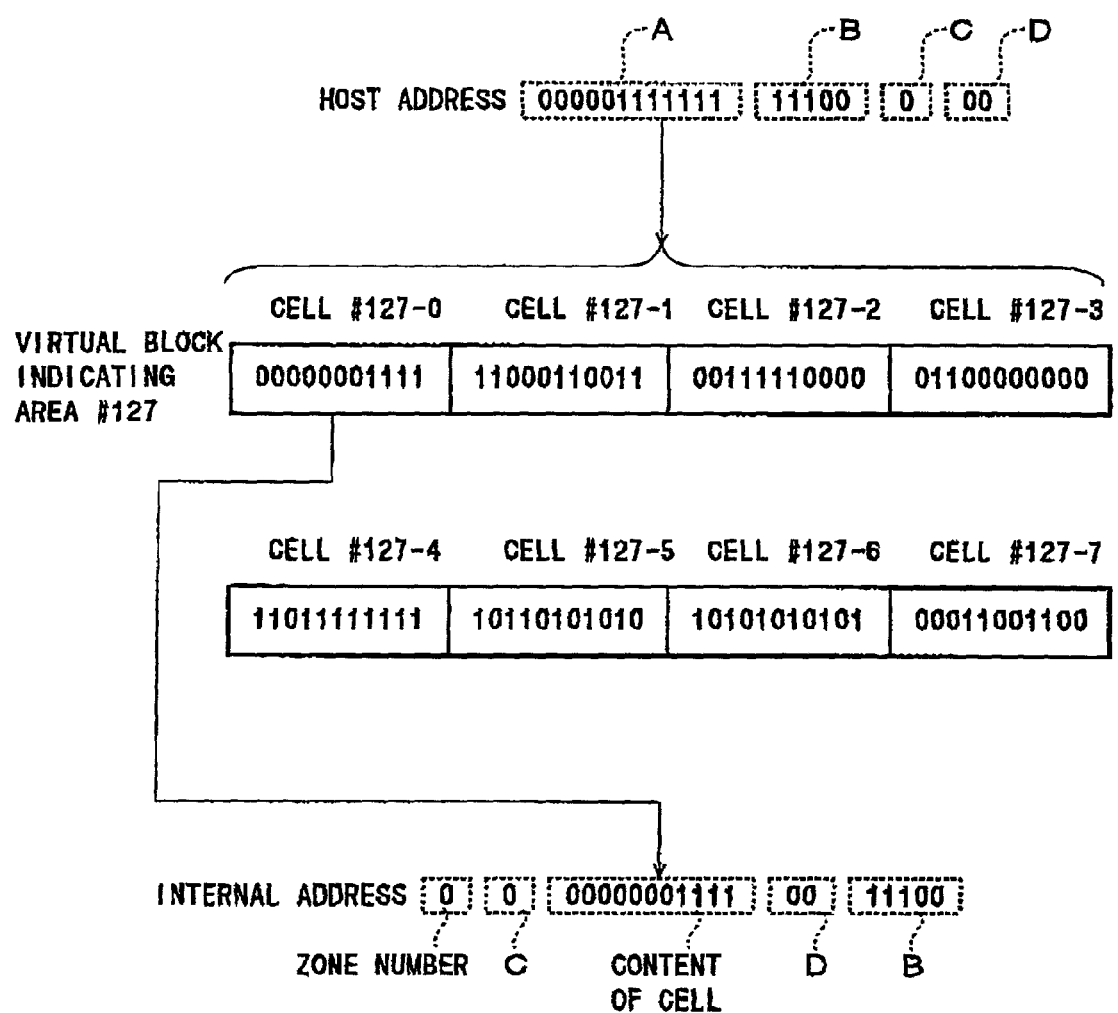
FIG. 27 is a schematic diagram showing a translation method for obtaining an internal address using the address translation table 36 during the data read operation.

FIG. 27 is a schematic diagram showing the translation method for obtaining an internal address using the address translation table 36 during the data read operation.

Here, assume that the host computer requests data reading using the host address "00000111111111100000B".

In FIG. 27, for convenience, "A" is used to indicate the upper 12 bits of the host address, "B" to indicate 5 bits composed of the upper 13th bit to the upper 17th bit of the host address, "C" to indicate the upper 18th bit of the host address, and "D" to indicate the lower 2 bits of the host address.

First, the upper 12 bits (A) are extracted from the host address of 20 bits and divided by "2000" under the control of the microprocessor 6. The zone to be selected is determined from the quotient (0 or 1) and the virtual block indicating area is determined from the remainder (0 to 1999). In the exemplified case, because the upper 12 bits (A) of the host address are "000001111111B", the quotient is "0B" and the remainder is "000001111111B (127)". This means that the zone to be selected is the zone #0 and the virtual block indicating area to be selected is virtual block indicating area #127.

Next, the virtual block indicating area #127 is selected from the address translation table 36 stored in the SRAM work area 8, and the content of the one cell whose branch number is coincident with the lower 3 bits of the host address is read out under the control of the microprocessor 6. In the exemplified case, because the lower 3 bits of the host address are "000B (0)", the cell whose content is read out is the cell #127-0. As shown in FIG. 27, it is assumed that the content of the cell #127-0 is "00000001111B".

Next, the selected zone number, the upper 18th bit (C) of the host address, the content read from the cell, the lower 2 bits (D) of the host address, and the 5 bits (B) composed of the upper 13th bit to the upper 17th bit of the host address are combined in this order. The combined address is the internal address. In the exemplified case, the selected zone number is "0B", the upper 18th bit (C) of the host address is "0B", the content read from the cell is "00000001111B", the lower 2 bits (D) of the host address is "00B", and the 5 bits (B) composed of the upper 13th bit to the upper 17th bit of the host address is "11100B", so that "00000000111110011100B" is obtained as the internal address as shown in FIG. 27.

This completes the address translation from the host address to the internal address.

The data read operations after the address translation is completed are the same as in the flash memory systems 1 and 31 of the above-described embodiments. In this case, the data stored in the physical page #28 of the physical block #60 included in the flash memory chip 32-0 is read out. The physical page #28 of the physical block #60 corresponds to the virtual page #224 of the virtual block #127.

Figure 28:
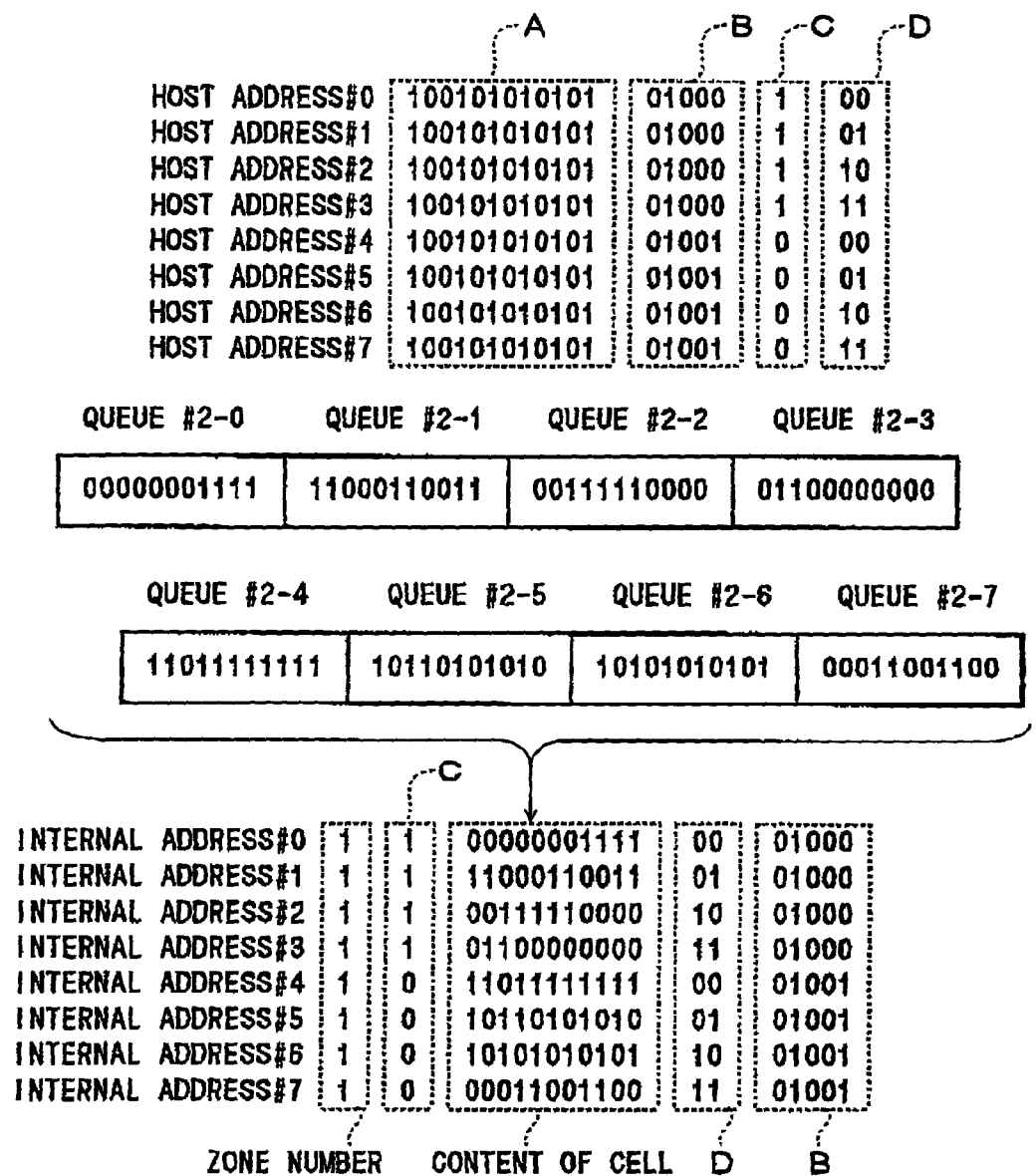
FIG. 28 is a schematic diagram showing a translation method for obtaining an internal address using the address translation table 36 during the data write operation.

FIG. 28 is a schematic diagram showing the translation method for obtaining an internal address using the address translation table 36 during the data write operation.

Here, assume that the host computer 5 requests data writing using the successive host addresses #0 to #7, "10010101010101000100B" to "10010101010101001011B".

As shown in FIG. 28, because the upper 12 bits (A) of the host addresses #0 to #7 are "100101010101B", the quotient and remainder obtained by dividing them by "2000" are "1B (1)" and "00110000101B (389)". This means that the zone to be selected is the zone #1 and the virtual block indicating area to be selected is virtual block indicating area #2389 (389+2000).

Next, among the queue sets #0 to #3 constituting the erased block queue 37, a queue set corresponding to the zone #1, queue set #2 or #3, is selected and the contents stored in the each queue #2-0 to #2-3 or each queue #3-0 to #3-3 constituting the selected queue set #2 or #3 are read out under the control of the microprocessor 6. As mentioned above, the contents of the each queue #2-0 to #2-3 and each queue #3-0 to #3-3 are the upper 11 bits of the physical block addresses of the free blocks in the flash memory chip 32-2; and the contents of the each queue #2-4 to #2-7 and each queue #3-4 to #3-7 are the upper 11 bits of the physical block addresses of the free blocks in the flash memory chip 32-3. In the exemplified case, it is assumed the queue set #2 is selected so that the contents of the queues #2-0 to #2-7 are "00000001111B", "11000110011B", "00111110000B", "01100000000B", "11011111111B", "1011010010B", "10101010101B", and "00011001100B".

When the contents of the queues #2-0 to #2-7 are read out, they are stored in the virtual block indicating area #2389 of the address translation table 36 and the corresponding flag is changed from "0" to "1". Then, internal addresses are generated under the control of the microprocessor 6.

As shown in FIG. 28, the method for generating the internal addresses is the same as in the case of data read operation. That is, the selected zone number, the upper 18th bit (C) of the host addresses #0 to #7, the content read from the queues, the lower 2 bits (D) of the host addresses #0 to #7, and the 5 bits (B) composed of the upper 13th bit to the upper 17th bit of the host addresses #0 to #7 are combined in this order. Thus, internal addresses #0 to #7 shown in FIG. 28 are obtained.

This completes the address translation from the host addresses #0 to #7 to the internal addresses #0 to #7.

Figure 29:
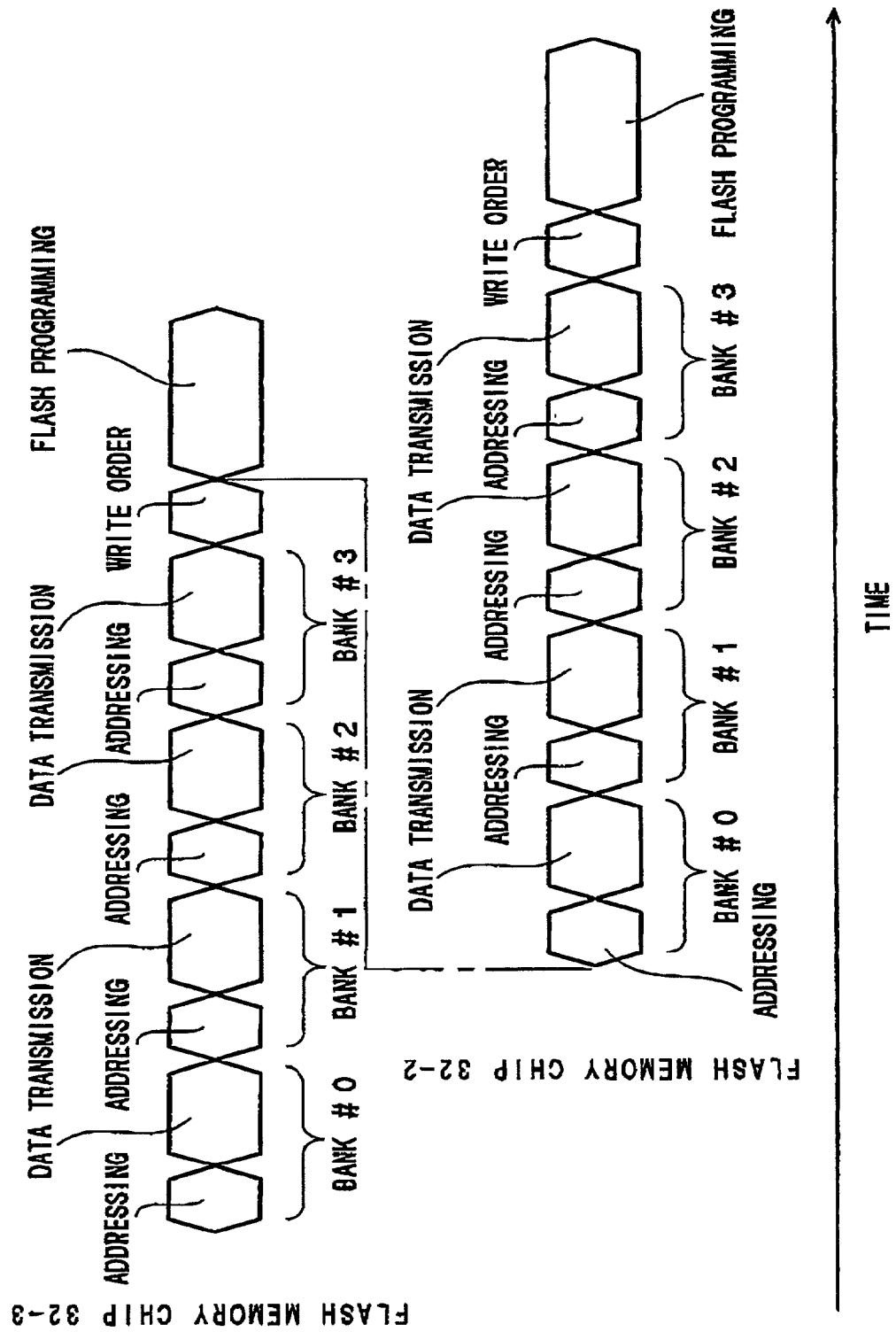
FIG. 29 is a timing chart showing the set of data write operations by a flash sequencer block 12.

FIG. 29 is a timing chart showing the set of data write operation by a flash sequencer block 12.

At first, the flash sequencer block 12 activates the chip selection signal #3 which corresponds to the flash memory chip 32-3 based on the upper 2 bits of the internal address #0, "11B (3)", stored in the prescribed register.

Next, the flash sequencer block 12 directs the flash memory interface block 10 to send the lower 18 bits of the internal address #0, "000000011110001000B", and the data transferring command stored in the prescribed registers to the bus 15. The lower 18 bits of the internal address #0 and the data transferring command are only valid for the flash memory chip 32-3 because the chip selection signal #3 is in the active state. Then, the register #0 employed in the flash memory chip 32-3 is activated based on the 2 bits composed of the upper 14th and 15th bits (D) of the internal address #0 (addressing).

As a result, the flash memory chip 32-3 is enabled to write data into the physical page designated by the lower 18 bits of the internal address #0, "000000011110001000B".

Next, the data corresponding to the host address #0 among the write data stored in the buffer 9 and additional information including the error correction code to be written to the redundant area 26 are supplied to the bus 15 via the flash memory interface block 10 under the control of the flash sequencer block 12. The write data and additional information including the error correction code are stored in the register #0 of the flash memory chip 32-3 because the register #0 is in the active state (data transmission).

The addressing and data transmission are also performed with respect to the data corresponding to the host addresses #1 to #3. Temporary storing of the write data and additional information including the error correction code corresponding to the host addresses #0 to #3 to the registers #0 to #3 of the flash memory chip 32-3 is thus completed.

Next, the flash sequencer block 12 issues the internal write command stored in the prescribed register to the flash memory chip 32-3 (write order).

In response to the write order, the flash memory chip 32-3 stores the data and additional information including the error correction code temporarily stored in the registers #0 to #3 to the address designated by the addressing operation (flash programming).

During the flash programming, the flash sequencer block 12 activates the chip selection signal #2 which corresponds to the flash memory chip 32-2 based on the upper 2 bits of the internal address #4, "10B (2)", stored in the prescribed register.

Next, the flash sequencer block 12 directs the flash memory interface block 10 to send the lower 18 bits of the internal address #4 and the data transferring command stored in the prescribed registers to the bus 15. The lower 18 bits of the internal address #4 and the data transferring command are only valid for the flash memory chip 32-2 because the chip selection signal #2 is in the active state. Then, the register #0 employed in the flash memory chip 32-2 is activated based on the 2 bits composed of the upper 14th and 15th bits (D) of the internal address #0 (addressing).

As a result, the flash memory chip 32-2 is enabled to write data into the physical page designated by the lower 18 bits of the internal address #4.

Next, the data corresponding to the host address #4 among the write data stored in the buffer 9 and additional information including the error correction code to be written to the redundant area 26 are supplied to the bus 15 via the flash memory interface block 10 under the control of the flash sequencer block 12. The write data and additional information including the error correction code are stored in the register #0 of the flash memory chip 32-2 because the register #0 is in the active state (data transmission).

The addressing and data transmission are also performed with respect to the data corresponding to the host addresses #1 to #3. Temporary storing of the write data and additional information including the error correction code corresponding to the host addresses #4 to #7 to the registers #0 to #3 of the flash memory chip 32-2 is thus completed.

Next, the flash sequencer block 12 issues the internal write command stored in the prescribed register to the flash memory chip 32-2 (write order).

In response to the write order, the flash memory chip 32-2 stores the data and additional information including the error correction code temporarily stored in the registers #0 to #3 to the address designated by the addressing operation (flash programming). The set of data write operations by the flash sequencer block 12 is thus completed.

By the set of data write operations, the data corresponding to the host address #0 is stored in the physical page #8 of the physical block #60 included in the flash memory chip 32-3, the data corresponding to the host address #1 is stored in the physical page #8 of the physical block #6349 included in the flash memory chip 32-3, the data corresponding to the host address #2 is stored in the physical page #8 of the physical block #1986 included in the flash memory chip 32-3, the data corresponding to the host address #3 is stored in the physical page #8 of the physical block #3075 included in the flash memory chip 32-3, the data corresponding to the host address #4 is stored in the physical page #9 of the physical block #7164 included in the flash memory chip 32-2, the data corresponding to the host address #5 is stored in the physical page #9 of the physical block #5801 included in the flash memory chip 32-2, the data corresponding to the host address #6 is stored in the physical page #9 of the physical block #5462 included in the flash memory chip 32-2, and the data corresponding to the host address #7 is stored in the physical page #9 of the physical block #819 included in the flash memory chip 32-2. The physical pages #8 of the physical blocks #60, #6349, #1986, and #3075 of the flash memory chip 32-3 and the physical pages #9 of the physical blocks #7164, #5801, #5462, and #819 of the flash memory chip 32-2 correspond to the virtual pages #68 to #75 of the virtual block #2389.

As explained above, the flash memory system 35 of this embodiment has both the feature of the flash memory system 1 wherein the virtual block is formed by using a plurality of flash memory chips and the feature of the flash memory system 35 wherein the virtual block is formed by using a plurality of flash memory chips of bank type. Therefore, virtual blocks constituted by the physical blocks can be formed in a number greater than the number of flash memory chips 32 employed in the flash memory system 35 and greater than the number of banks of the flash memory chips 32. Since this means that the number of pages in which the parallel write operation can be performed is increased, so that a series of data write operations can be performed at higher speed.

The present invention has thus been shown and described with reference to specific embodiments. However, it should be noted that the present invention is in no way limited to the details of the described arrangements but changes and modifications may be made without departing from the scope of the appended claims.

For example, in the flash memory system 1 of the above-described embodiment, each virtual block is formed by virtually combined four physical blocks each of which belongs to a different flash memory chip from the others. However, the number of physical blocks constituting one virtual block is not limited to four but can be another number such as two or eight. It is worth noting that it is not essential to match the number of physical blocks constituting one virtual block with the number of flash memory chips employed in the flash memory system. Therefore, the number of physical blocks constituting one virtual block can be smaller than the number of flash memory chips employed in the flash memory system. For example, in the case where eight flash memory chips are employed in the flash memory system, one virtual block can be constituted of four physical blocks.

Further, in the flash memory system 31 of the above-described embodiment, each virtual block is formed by virtually combined four physical blocks each of which belongs to a different bank from the others. However, the number of physical blocks constituting one virtual block is not limited to four but can be another number such as two or eight for example. It is worth noting that it is not essential to match the number of physical blocks constituting one virtual block with the number of banks included in each flash memory chip. Therefore, the number of physical blocks constituting one virtual block can be smaller than the number of banks included in each flash memory chip. For example, in the case where each flash memory chip is divided into eight banks, one virtual block can be constituted of four physical blocks.

Furthermore, in the flash memory system 35 of the above-described embodiment, each virtual block is formed by virtually combining eight physical blocks, four of which belong to different banks of one flash memory chip and the remaining four of which belong to different banks of another flash memory chip. However, the number of physical blocks constituting one virtual block is not limited to eight but can be another number such as sixteen.

Further, in the flash memory system 1 of the above-described embodiment, when a data overwrite operation is performed, one page of data is read from each of the four physical blocks constituting the source virtual block, the four pages of data are temporarily stored, and the four pages of data are then written in the four physical blocks constituting the destination virtual block. However, the temporarily stored data is not limited to four pages of data but can, for example, be one page of data or two pages of data. When the number of pages of data temporarily stored is smaller than the number of cells constituting one virtual block, the required memory capacity of the buffer 9 can be reduced but the time required to complete a series of operations becomes longer because the transfer efficiency is lowered.

Furthermore, in the flash memory systems 1, 31, 35 according to the above-described embodiments, the address translation table 27, 33, 36 covering all physical blocks in which data are stored is stored in the SRAM work area 8. However, it is not necessary to store an address translation table covering all such physical blocks and an address translation covering only part of such physical blocks can be stored instead. In this case, the required capacity of the SRAM work area 8 is smaller. However, in the case where only a partial address translation table is stored, the address translation table must be updated each time an access request is made with respect to a physical block whose information is not stored in the address translation table.

Moreover, the flash memory systems 1, 31 and 35 are embodied as a card employing the four flash memory chips 2-0 to 2-3 or 32-0 to 32-3 and the controller 3. However, the flash memory system according to the present invention is not limited to a card-shape and can be embodied in other shapes such as stick shape.

Further, according to the above-described embodiments, the flash memory systems 1, 31 and 35 are embodied as a card in which the four flash memory chips 2-0 to 2-3 or 32-0 to 32-3 and the controller 3 are integrated. However, the present invention is not limited to a flash memory system in which the flash memory chips 2-0 to 2-3 or 32-0 to 32-3 and the controller 3 are integrated in the same package and the flash memory chips and controller can instead be packaged individually. In this case, connectors must be provided in the package for the flash memory chips 2-0 to 2-3 or 32-0 to 32-3 and the package for the controller 3 to establish electrical and physical connection therebetween. With this arrangement, the package for the flash memory chips 2-0 to 2-3 or 32-0 to 32-3 can be removably attached to the package for the controller 3. Moreover, the invention is also not limited to the flash memory chips 2-0 to 2-3 or 32-0 to 32-3 being integrated in the same package but also encompasses the case where they are packaged in individual packages.

Further, in the flash memory systems 1, 31 and 35 according to the above-described embodiments, the memory capacity of each of the flash memory chips 2-0 to 2-3 and 32-0 to 32-3 is 128M bytes (1G bits). However, the memory capacity of each of the flash memory chips employed in the flash memory system according to the present invention is not limited to 128M bytes (1G bits) and can be another capacity such as 32M bytes (256M bits).

Furthermore, in the flash memory systems 1, 31 and 35 according to the above-described embodiments, each page constituting the minimum access unit is composed of 512 bytes. However, the capacity of the page constituting the minimum access unit is not limited to 512 bytes but can be another capacity.

Furthermore, in the flash memory systems 1, 31 and 35 according to the above-described embodiment, each flash memory cell 16 employed in the flash memory chips 2-0 to 2-3 and 32-0 to 32-3 can store 1 bit of data. However, the flash memory cells employed in the flash memory chip can be ones enabled to store two or more bits of data by controlling the number of electrons injected into the floating gate electrode 21.

Further, in the flash memory systems 1, 31 and 35 according to the above-described embodiment, each physical block is composed of 32 pages. However, the number of pages composing each physical block is not limited to 32 and can be another number such as 16 or 64.

Further, in the flash memory system 1 according to the above-described embodiment, the erased block queue 30 is composed of 6 queue sets. However, the number of queue sets constituting the erased block queue 30 is not limited to 6 and can be another number such as 1 or 8. Similarly, in the flash memory system 31 according to the above-described embodiment, the erased block queue 34 is composed of the queue sets each assigned for one of the flash memory chip 32-0 to 32-3. However, the number of queue sets assigned for one flash memory chip 32-0 to 32-3 is not limited to 1 and can be another number such as 2 or 4. Similarly, in the flash memory system 35 according to the above-described embodiment, the erased block queue 35 is composed of queue sets in which two queue sets are assigned for each zone #0 and #1. However, the number of queue sets assigned for each zone is not limited to two and can be another number such as 1 or 4.

Furthermore, in the flash memory systems 1, 31 and 35 according to the above-described embodiments, flash memory chips 2 or 32 of NAND type are used. However, the flash memory chip which can be controlled by the method according to the present invention is not limited to the flash memory chip of NAND type and flash memory chips of other types, AND type, for example, can also be controlled.

Further, in this specification and the appended claims, the respective means need not necessarily be physical means and arrangements whereby the functions of the respective means are accomplished by software fall within the scope of the present invention. In addition, the function of a single means may be accomplished by two or more physical means and the functions of two or more means may be accomplished by a single physical means.

The present invention can be embodied as a PC card conforming with the standard proposed by the PCMCIA (Personal Computer Memory Card International Association). Further, the present invention can be embodied as a highly miniaturized memory card realized by the development of high-integration technologies for semiconductor devices, such as the Compact Flash™ proposed by the CFA (Compact Flash Association), the MMC™ (MultiMedia Card) proposed by the MultiMedia Card Association, the Memory Stick™ proposed by SONY corporation, the SD Memory Card™ proposed by Matsushita Electric Corporation, or the like.

As explained in the foregoing, the present invention provides a memory controller, a flash memory system and a method for controlling the flash memory that can perform a series of data write operations to a flash memory device at high speed.

The invention claimed is:

1. A memory controller for accessing a memory having a plurality of physical blocks based on a host address supplied from a host computer, comprising:
    means for dividing the physical blocks into a plurality of memory chips different from each other;
    means for forming a plurality of virtual blocks by virtually combining a plurality of physical blocks each of which belongs to a different memory chip; and
    means for assigning adjacent host addresses into different physical blocks belonging to the same virtual block;
    wherein each of the physical block has a user area and a redundant area, and wherein information specifying a virtual block belonging to itself is stored in the redundant area but is not stored in the user area.

2. The memory controller as claimed in claim 1, further comprising means, responsive to a data writing request issued from the host computer based on a plurality of successive host addresses, for successively transferring data to the memory including the plurality of physical blocks assigned successive host addresses and belonging to the same virtual block, and means for requesting the memory substantially at the same time to store the data into associated physical blocks.

3. A memory controller for converting a host address supplied from a host computer into an internal address and accessing a memory having a plurality of physical blocks divided into a plurality of memory chips different from each other based on the internal address,
    wherein based on at least a part of the host addresses including the least significant bit, the memory controller converts successive host addresses supplied from the host computer into the internal addresses whose associated physical blocks are different from one another and the physical blocks accessed by the internal addresses associated with the different physical blocks belong to different memory chips one another; and
    wherein each of the physical blocks has a user area and a redundant area, and wherein information specifying a virtual block belonging to itself is stored in the redundant area but is not stored in the user area.

4. A memory controller for converting a host address supplied from a host computer into an internal address and accessing a memory having a plurality of physical blocks divided into a plurality of memory chips different from each other based on the internal address,
    wherein in that the memory controller converts a first host address into an internal address associated with a first physical block, converts a second host address following the first host address into an internal address associated with a second physical block, and converts a third host address following the second host address into an internal address associated with a physical block different from the second physical block,
    wherein the physical block different from the second physical block is a third physical block and the first to third physical blocks belong to different memory chips from one another; and
    wherein each of the physical block has a user area and a redundant area, and wherein information specifying a virtual block a to itself stored in the redundant area but is not stored in the user area.

5. A flash memory system comprising a flash memory having a plurality of physical blocks and a memory controller accessing the flash memory based on a host address supplied from a host computer, the memory controller, comprising:
    means for dividing the physical blocks into a plurality of memory chips different from each other;
    means for forming a plurality of virtual blocks by virtually combining a plurality of physical blocks each of which belongs to a different memory chip; and
    means for assigning adjacent addresses into different physical blocks belonging to the same virtual block,
    wherein each of the physical block has a user area and a redundant area, and wherein information specifying a virtual block belonging to itself stored in the redundant area but is not stored in the user area.

6. The flash memory system as claimed in claim 5, wherein the flash memory and the memory controller are enclosed in the same package.

7. The flash memory system as claimed in claim 6, wherein the package is card-shaped.

8. The flash memory system as claimed in claim 7, wherein the flash memory and the memory controller are enclosed in the same package.

9. A flash memory system comprising a flash memory having a plurality of physical blocks divided into a plurality of memory chips different from each other and constituted of a plurality of physical pages and a memory controller accessing the flash memory based on a host address supplied from a host computer,
    the memory controller converting a first host address into an internal address associated with a physical page number univocally specified by the first host address belonging to a first physical block and converting a second host address following the first host address into an internal address associated with a physical page assigned the page number belonging to a second physical block; and
    wherein each of the physical block has a user area and a redundant area, and wherein information specifying a virtual block belonging to itself stored in the redundant area but is not stored in the user area.

10. The flash memory system as claimed in claim 9, wherein the memory controller stores information associating the first physical block with the second physical block.

11. The flash memory system as claimed in claim 9, wherein the first physical block stores information associating it with the second physical block and the second physical block stores information associating it with the first physical block.

12. The flash memory system as claimed in claim 10, wherein the first physical block stores information associating it with the second physical block and the second physical block stores information associating it with the first physical block.

13. A method for controlling a flash memory device, comprising:
- successively transferring data to a memory device responsive to a data writing request issued from a host computer based on a plurality of successive host addresses, the data including a plurality of physical block divided into a plurality of memory chips different from each other and assigned successive host addresses and belonging to the same virtual block; and
- requesting the memory device, substantially at the same time, to stored the data into associated physical blocks, wherein each of the physical block has a user area and a redundant area, and wherein information specifying a virtual block belonging to itself stored in the redundant area but is not stored in the user area.

14. A method for controlling a flash memory device having a plurality of physical blocks each of which is classified in one of a plurality of memory chips, comprising:
- reading virtual block numbers that are stored respectively, in the plurality of physical blocks;
- virtually combining the plurality of physical blocks belonging to different memory chips from one another in which the read virtual block numbers are coincident with one another; and
- treating the virtually combined physical blocks as a single virtual block, wherein each of the physical block has a user area area and wherein information specifying a virtual block belonging to itself stored in the redundant area but is not stored in the user area.

* * * * *

UNITED STATES PATENT AND TRADEMARK OFFICE
CERTIFICATE OF CORRECTION

PATENT NO. : 7,020,739 B2 Page 1 of 1
APPLICATION NO. : 10/011248
DATED : March 28, 2006
INVENTOR(S) : Naoki Mukaida, Kenzo Kita and Yukio Terasaki It is certified that error appears in the above-identified patent and that said Letters Patent is hereby corrected as shown below:

Column 13,
Line 26, delete "is not all is" and insert -- is not all 1s --.

Column 39,
Line 32, delete "block" and insert -- blocks --.

Column 40,
Line 1, delete "in that".
Line 55, delete "block" and insert -- blocks --.
Line 57, between "itself" and stored" insert -- is --.

Column 42,
Line 14, (second occurrence) delete "area".

Signed and Sealed this

Fourth Day of July, 2006

JON W. DUDAS
*Director of the United States Patent and Trademark Office*